United States Patent
Harada et al.

(10) Patent No.: US 8,525,197 B2
(45) Date of Patent: Sep. 3, 2013

(54) SEMICONDUCTOR LIGHT EMITTING DEVICE AND METHOD FOR MANUFACTURING SAME

(75) Inventors: Yoshiyuki Harada, Tokyo (JP); Toshiki Hikosaka, Kanagawa-ken (JP); Tomonari Shioda, Kanagawa-ken (JP); Koichi Tachibana, Kanagawa-ken (JP); Hajime Nago, Kanagawa-ken (JP); Shinya Nunoue, Chia-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 222 days.

(21) Appl. No.: 13/035,304

(22) Filed: Feb. 25, 2011

(65) Prior Publication Data

US 2012/0012814 A1  Jan. 19, 2012

(30) Foreign Application Priority Data

Jul. 16, 2010 (JP) ................................. 2010-161375

(51) Int. Cl.
*H01L 31/072* (2012.01)

(52) U.S. Cl.
USPC .......... 257/97; 257/13; 257/96; 257/E33.012; 257/E33.048; 438/47

(58) Field of Classification Search
USPC ................ 257/13, 96, 97, E33.012, E33.048; 438/47
See application file for complete search history.

(56) References Cited

U.S. PATENT DOCUMENTS

| | | | |
|---|---|---|---|
| 7,642,562 B2 * | 1/2010 | Kovsh et al. ................ | 257/98 |
| 7,759,689 B2 * | 7/2010 | Bour ........................... | 257/96 |
| 7,858,962 B2 * | 12/2010 | Smith et al. ................. | 257/13 |
| 2001/0030318 A1 * | 10/2001 | Nakamura et al. .......... | 257/13 |
| 2003/0059971 A1 * | 3/2003 | Chua et al. .................. | 438/46 |
| 2008/0220555 A1 * | 9/2008 | Saxler et al. ................ | 438/47 |
| 2009/0179191 A1 * | 7/2009 | Smith et al. ................. | 257/13 |
| 2010/0078625 A1 * | 4/2010 | Hsu ............................ | 257/13 |
| 2010/0224857 A1 * | 9/2010 | Soh et al. .................... | 257/13 |

FOREIGN PATENT DOCUMENTS

| | | |
|---|---|---|
| JP | 2005-244209 A | 9/2005 |
| JP | 2005-277401 A | 10/2005 |
| JP | 2007-19455 | 1/2007 |
| JP | 2010-10444 A | 1/2010 |
| JP | 4475368 B2 | 6/2010 |

OTHER PUBLICATIONS

Japanese Office Action Issued Sep. 6, 2012 in Patent Application No. 2010-161375 (with English translation).
U.S. Appl. No. 13/029,416, filed Feb. 17, 2011, Hikosaka, et al.
Japanese Office Action issued May 23, 2012 in Patent Application No. 2010-161375 with English Translation.

* cited by examiner

Primary Examiner — Allan R Wilson
(74) Attorney, Agent, or Firm — Oblon, Spivak, McClelland, Maier & Neustadt, L.L.P.

(57) ABSTRACT

According to one embodiment, a semiconductor light emitting device includes an n-type semiconductor layer, a p-type semiconductor layer, and a light emitting part provided therebetween. The light emitting part includes a plurality of light emitting layers. Each of the light emitting layers includes a well layer region and a non-well layer region which is juxtaposed with the well layer region in a plane perpendicular to a first direction from the n-type semiconductor layer towards the p-type semiconductor layer. Each of the well layer regions has a common An In composition ratio. Each of the well layer regions includes a portion having a width in a direction perpendicular to the first direction of 50 nanometers or more.

17 Claims, 12 Drawing Sheets

|     | tmax | tmin |
| --- | --- | --- |
| LE8 | 2.5 | 1.0 |
| LE7 | 1.3 | 0 |
| LE6 | 2.1 | 1.1 |
| LE5 | 1.9 | 0 |
| LE4 | 1.9 | 0.2 |
| LE3 | 2.4 | 1.1 |
| LE2 | 1.9 | 0 |
| LE1 | 2.3 | 1.0 |

SEMICONDUCTOR LIGHT EMITTING DEVICE AND METHOD FOR MANUFACTURING SAME

CROSS-REFERENCE TO RELATED APPLICATIONS

This application is based upon and claims the benefit of priority from the prior Japanese Patent Application No. 2010-161375, filed on Jul. 16, 2010; the entire contents of which are incorporated herein by reference.

FIELD

Embodiments described herein relate generally to a semiconductor light emitting device and a method for manufacturing the same.

BACKGROUND

Group III-nitride semiconductors have been commercialized as light emitting devices such as blue light emitting diodes (LED) and blue-violet semiconductor lasers (LD). In light emitting devices using a group III-nitride semiconductor, a luminous efficiency decreases as the wavelength becomes longer than blue light, so the luminous efficiency of a green light emitting device, for example, is significantly lower than the luminous efficiency of a blue light emitting device.

DETAILED DESCRIPTION

Figure 1A:
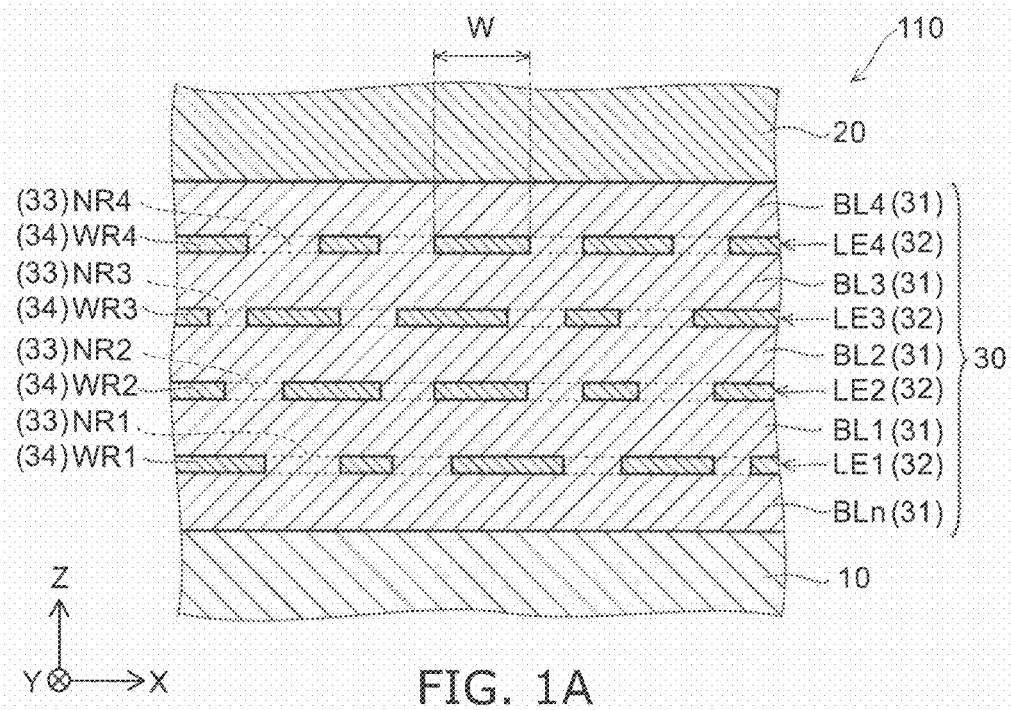
FIG. 1A and FIG. 1B are schematic cross-sectional views illustrating the configurations of semiconductor light emitting devices according to a first embodiment.

In general, according to one embodiment, a semiconductor light emitting device includes an n-type semiconductor layer, a p-type semiconductor layer, and a light emitting part. The n-type semiconductor layer and the p-type semiconductor layer include a nitride semiconductor. The light emitting part is provided between the n-type semiconductor layer and the p-type semiconductor layer and includes a first light emitting layer, a first barrier layer, a second light emitting layer, a second barrier layer, and an n-side barrier layer. The first light emitting layer includes a nitride semiconductor and includes a first well layer region including In with an In composition ratio among the group III elements not less than 20 atomic percent and a first non-well layer region juxtaposed with the first well layer region in a plane perpendicular to a first direction from the n-type semiconductor layer towards the p-type semiconductor layer. The first non-well layer region includes an In composition ratio lower than an In composition ratio of the first well layer region. The first barrier layer is provided between the first light emitting layer and the p-type semiconductor layer and has a band gap energy larger than a band gap energy of the first well layer region. The second light emitting layer is provided between the first barrier layer and the p-type semiconductor and includes a nitride semiconductor. The second light emitting layer includes a second well layer region including In with an In composition ratio same as the In composition ratio of the first well layer region and a second non-well layer region juxtaposed with the second well layer region in a plane perpendicular to the first direction. The second non-well layer region has an In composition ratio lower than the In composition ratio of the second well layer region. The second barrier layer is provided between the second light emitting layer and the p-type semiconductor layer and has a band gap energy larger than a band gap energy of the second well layer region. The n-side barrier layer is provided between the first light emitting layer and the n-type semiconductor layer and has a band gap energy larger than the band gap energy of the first well layer region. At least one of the first well layer region and the second well layer region includes a portion having a width in a direction perpendicular to the first direction of 50 nanometers or more.

Exemplary embodiments will now be described with reference to the drawings.

The drawings are schematic or conceptual; and the relationships between the thickness and width of portions, the proportional coefficients of sizes among portions, etc., are not necessarily the same as the actual values thereof. Further, the dimensions and proportional coefficients may be illustrated differently among drawings, even for identical portions.

In the specification and the drawings of the application, components similar to those described in regard to a drawing thereinabove are marked with like reference numerals, and a detailed description is omitted as appropriate.

First Embodiment

Figure 1B:
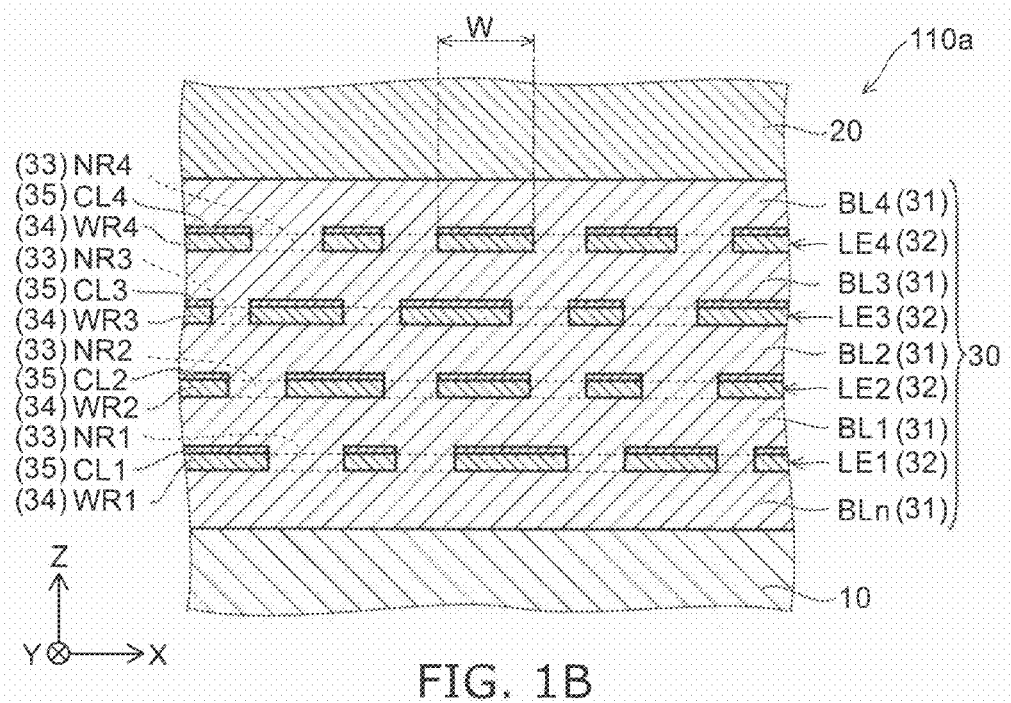

FIG. 1A and FIG. 1B are schematic cross-sectional views illustrating the configurations of semiconductor light emitting devices according to a first embodiment.

Figure 2A:
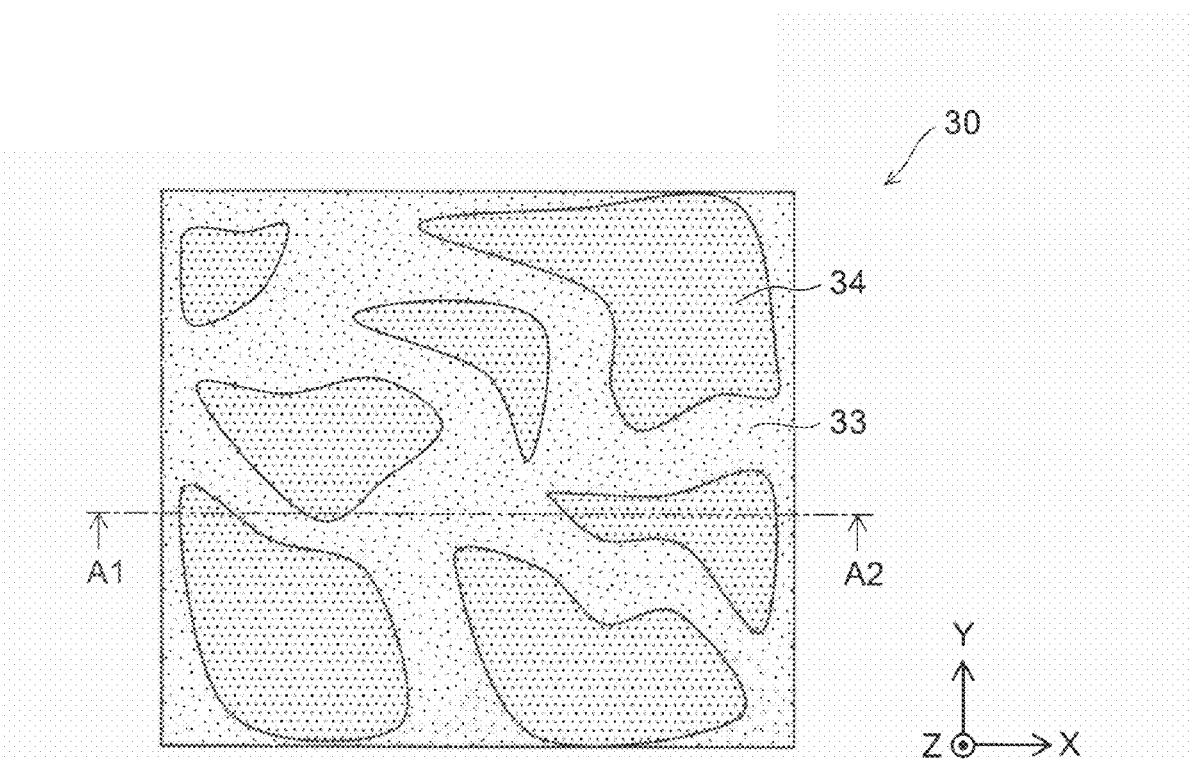
FIG. 2A and FIG. 2B are schematic plan views illustrating the configurations of the semiconductor light emitting devices according to the first embodiment.
Figure 2B:
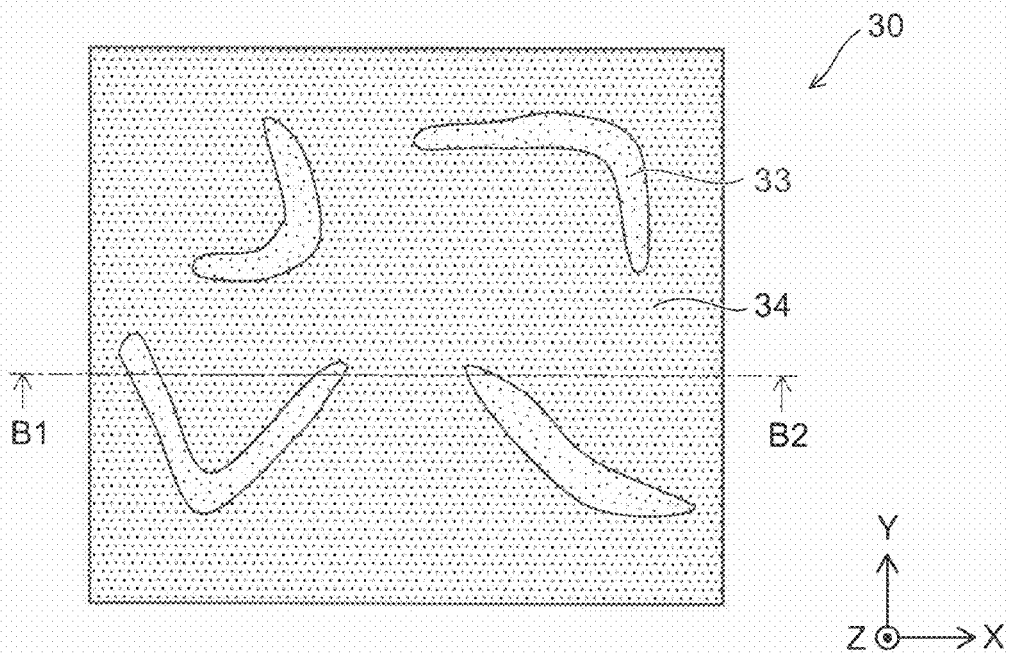

FIG. 2A and FIG. 2B are schematic plan views illustrating the configurations of the semiconductor light emitting devices according to the first embodiment.

FIG. 1A and FIG. 1B are cross-sectional views that correspond to the section line A1-A2 in FIG. 2A or the section line B1-B2 in FIG. 2B.

As illustrated in FIG. 1A, a semiconductor light emitting device 110 according to this embodiment includes an n-type semiconductor layer 10, a p-type semiconductor layer 20, and a light emitting part 30 provided between the n-type semiconductor layer 10 and the p-type semiconductor layer 20.

Here, the direction from the n-type semiconductor layer 10 toward the p-type semiconductor layer 20 is defined as a Z-axis direction (first direction). One direction perpendicular to the Z-axis direction is defined as an X axis direction. The direction perpendicular to the Z-axis direction and perpendicular to the X-axis direction is defined as a Y-axis direction.

The n-type semiconductor layer 10 and the p-type semiconductor layer 20 include a nitride semiconductor.

The light emitting part 30 has a Single Quantum Well (SQW) structure or a Multi Quantum Well (MQW) structure. In the semiconductor light emitting device 110 as illustrated in FIG. 1A, the light emitting part 30 has an MQW structure.

The light emitting part 30 includes a plurality of light emitting layers 32 (layers that include well layers) stacked along the Z-axis direction and a plurality of barrier layers 31 provided between each of the plurality of the light emitting layers 32. The light emitting layers 32 include a nitride semiconductor.

In this specification, the term "stacked" includes cases where constituents are stacked directly and also cases where constituents are stacked by inserting other layers therebetween.

Among the light emitting layers 32, the light emitting layer 32 closest to the n-type semiconductor layer 10 is referred to as a first light emitting layer LE1. Among the barrier layers 31, the barrier layer 31 closest to the n-type semiconductor layer 10 is referred to as an n-side barrier layer BLn. An ith barrier layer BLi (where "i" is an integer not less than 1) is provided between an ith light emitting layer LEi and the p-type semiconductor layer 20.

Each of the light emitting layers 32 includes well layer regions 34 and non-well layer regions 33 juxtaposed in the plane (in an X-Y plane) perpendicular to the first direction. The well layer regions 34 include In with an In composition ratio (atomic percent) among the group III elements of 20% or higher. The non-well layer regions 33 have an In composition ratio lower than that of the well layer regions 34. In the non-well layer regions 33, the In composition ratio is, for example, substantially the same as the In composition ratio of the barrier layer 31.

Having an In composition ratio higher than or equal to 20% in the well layer regions 34 corresponds to the well layer regions 34 having a band gap energy that corresponds to the wavelength of green light. The In composition ratio of the well layer regions 34 is not lower than 20% and not higher than 28%. In other words, the well layer regions 34 emit light with a wavelength of not less than 500 nanometers (nm) and not more than 560 nm.

FIG. 2A and FIG. 2B schematically illustrate examples of the shapes of the patterns of the well layer regions 34 and non-well layer regions 33 in one light emitting layer 32.

As the pattern illustrated in FIG. 2A, for example, in one light emitting layer 32, the independent island-like well layer regions 34 are provided in the non-well layer regions 33.

As the pattern illustrated in FIG. 2B, for example, in one light emitting layer 32, the independent island-like non-well layer regions 33 are provided in the well layer region 34.

Thus, the well layer regions 34 may be provided as continuous or may be provided as discontinuous (for example, island-like). The non-well layer regions 33 may be provided as continuous or may be provided as discontinuous (for example, island-like). The pattern configurations of the well layer regions 34 and the non-well layer regions 33 are arbitrary.

Thus, the light emitting part 30 of the semiconductor light emitting device 110 includes the first light emitting layer LE1, the n-side barrier layer BLn, and the first barrier layer BL1.

As illustrated in FIG. 1A, the first light emitting layer LE1 is provided between the n-type semiconductor layer 10 and the p-type semiconductor layer 20. The first light emitting layer LE1 includes a nitride semiconductor. The first light emitting layer LE1 includes a first well layer region WR1 and a first non-well layer region NR1. The first well layer region WR1 and the first non-well layer region NR1 are juxtaposed in a plane (in the X-Y plane) perpendicular to the first direction. The first well layer region WR1 contains In with an In composition ratio of 20 atomic percent or more among the group III elements. The In composition ratio of the first non-well layer region NR1 is lower than the In composition ratio of the first well layer region WR1. In the first non-well layer region NR1, the In composition ratio is, for example, substantially the same as the In composition ratio of the n-side barrier layer BLn and the first barrier layer BL1. For example, the first non-well layer region NR1 is a layer that contains substantially no In, and the In composition ratio of the first non-well layer region NR1 is substantially zero (0).

The first barrier layer BL1 is provided between the first light emitting layer LE1 and the p-type semiconductor layer 20, and has a band gap energy larger than a band gap energy of the first well layer region WR1.

The n-side barrier layer BLn is provided between the first light emitting layer LE1 and the n-type semiconductor layer 10, and has a band gap energy larger than the band gap energy of the first well layer region WR1.

In this example, the light emitting part 30 further includes a second light emitting layer LE2 and a second barrier layer BL2.

The second light emitting layer LE2 is provided between the first barrier layer BL1 and the p-type semiconductor layer 20. The second light emitting layer LE2 includes a nitride semiconductor. The second light emitting layer LE2 includes a second well layer region WR2 and a second non-well layer region NR2 juxtaposed in a plane perpendicular to the first direction. The second well layer region WR2 contains In with the same In composition ratio as the In composition ratio of the first well layer region WR1. The In composition ratio of the second non-well layer region NR2 is lower than the In composition ratio of the second well layer region WR2.

The In composition ratio of the second well layer region WR2 is the same as the In composition ratio of the first well layer region WR1, which indicates that the wavelength band of the light emitted from the second well layer region WR2 is substantially the same as the wavelength band of the light emitted from the first well layer region WR1. Specifically, the light emitted from the first well layer region WR1 is green, and the light emitted from the second well layer region WR2 is also green. For example, when the light emitted from the first well layer region WR1 is green, the light emitted from the second well layer region WR2 is not blue, is not yellow, and is not red.

The second barrier layer BL2 is provided between the second light emitting layer LE2 and the p-type semiconductor layer 20, and has a band gap energy larger than a band gap energy of the second well layer region WR2.

In this example, the light emitting part 30 further includes a third light emitting layer LE3, a third barrier layer BL3, a fourth light emitting layer LE4, and a fourth barrier layer BL4. The third light emitting layer LE3 includes a third well layer region WR3 and a third non-well layer region NR3 juxtaposed in the X-Y plane. The fourth light emitting layer LE4 includes a fourth well layer region WR4 and a fourth non-well layer region NR4 juxtaposed in the X-Y plane.

Thus, the light emitting part 30 can include N light emitting layers 32 (where N is an integer not less than 2) and N barrier layers 31.

When "i" is not less than 2 and not more than N, the light emitting part 30 further includes an ith light emitting layer LEi including an ith well layer region WR1 provided between the (i−1) barrier layer BL(i−1) and the p-type semiconductor layer 20, juxtaposed in the plane perpendicular to the first direction, and containing In with the same In composition ratio as the In composition ratio of an (i−1)th well layer region WR(i−1), and an ith non-well layer region NRi, having an In composition ratio lower than that in the ith well layer region WRi; and the ith barrier layer BLi provided between the ith light emitting layer LEi and the p-type semiconductor layer 20, having a band gap energy larger than the band gap energy of the ith well layer region WRi.

The In composition ratio of the ith well layer region WRi is the same as the In composition ratio of the (i−1)th well layer region WR(i−1), which indicates that the wavelength band of the light emitted from the ith well layer region WRi is substantially the same as the wavelength band of the light emitted from the (i−1)th well layer region WR(i−1). Specifically, the light emitted from the (i−1)th well layer region WR(i−1) is green, and the light emitted from the ith well layer region WRi is also green.

Thus, in the semiconductor light emitting device 110, the well layer regions 34 and the non-well layer regions 33 are provided in each of the light emitting layers 32 of the light emitting part 30. In other words, The light emitting layers 32 do not use well layers that are continuous over the whole face, but in the face of the light emitting layers 32, regions where the well layer is provided (well layer regions 34) and regions where the well layer is not provided (non-well layer regions 33) are provided.

The inventors discovered that in a light emitting layer 32 where the wavelength of the emitted light is green, which is longer than that of blue, in other words when the In composition ratio is higher than or equal to 20%, the luminous efficiency is increased when well layers that are continuous over the whole face of the light emitting layer 32 are not used, but regions where a well layer is provided (well layer region 34) and regions where a well layer is not provided (non-well layer region 33) are provided within the light emitting layer 32, and the well layers have portions that are divided in the X-Y plane.

The well layer region 34 has a portion with a width W in the X-Y plane of 50 nm or more. In the case where a plurality of light emitting layers 32 is provided, in at least one of the plurality of light emitting layers 32, the well layer region 34 has a portion where the width W is 50 nm or more.

Well layer regions 34 and non-well layer regions 33 can be distinguished by, for example, a transmission electron microscope (TEM) photograph of a cross-section of the light emitting part 30.

As discussed below, the well layer regions 34 in the light emitting layers 32 can be formed, for example, by a method wherein after forming a base layer that will become the well layer region 34 (for example, an InGaN layer), a cap layer is partially formed on the base layer, and In is removed from the regions of the base layer that are not covered with the cap layer (the In composition ratio is reduced). Thereby, the portion of the base layer covered with the cap layer becomes the well layer region 34, and the portion of the base layer not covered with the cap layer becomes the non-well layer region 33.

In other words, as illustrated in FIG. 1B, in the semiconductor light emitting device 110a according to this embodiment, a cap layer 35 is provided (on the p-type semiconductor layer 20 side) on the well layer regions 34. The cap layer 35 is not provided on the non-well layer regions 33.

Thus, the light emitting part 30 includes the first light emitting layer LE1, the n-side barrier layer BLn, the first barrier layer BL1, and a first cap layer CL1.

The first light emitting layer LE1 is provided between the n-type semiconductor layer 10 and the p-type semiconductor 20, juxtaposed in the plane perpendicular to the first direction, and includes the first well layer region WR1 containing In and the first non-well layer region NR1 with an In composition ratio lower than that in the first well layer region WR1. The first light emitting layer LE1 includes a nitride semiconductor.

The n-side barrier layer BLn is provided between the first light emitting layer LE1 and the n-type semiconductor layer 10, and has a band gap energy larger than the band gap energy of the first well layer region 34.

The first barrier layer BL1 is provided between the first light emitting layer LE1 and the p-type semiconductor layer 20, and has a band gap energy larger than the band gap energy of the first well layer region 34.

The first cap layer CL1 is in contact with the first well layer region 34 between the first well layer region 34 of the first light emitting layer LE1 and the first barrier layer BL1.

The light emitting part 30 further includes the second light emitting layer LE2, the second barrier layer BL2, and the second cap layer CL2.

The second light emitting layer LE2 includes the second well layer region WR2 provided between the first barrier layer BL1 and the p-type semiconductor layer 20, juxtaposed in the plane perpendicular to the first direction and containing In with the same In composition ratio as the In composition ratio of the first well layer region WR1, and the second non-well layer region NR2 which has an In composition ratio lower than that in the second well layer region WR2. The second light emitting layer LE2 includes a nitride semiconductor.

The second barrier layer BL2 is provided between the second light emitting layer LE2 and the p-type semiconductor layer 20, and has a band gap energy larger than the band gap energy of the second well layer region WR2.

The second cap layer CL2 is in contact with the second well layer region WR2 between the second well layer region WR2 of the second light emitting layer LE2 and the second barrier layer BL2.

In the semiconductor light emitting device 110a, the light emitting part 30 further includes the third light emitting layer LE3, the third barrier layer BL3, a third cap layer CL3, the fourth light emitting layer LE4, the fourth barrier layer BL4, and the fourth cap layer CL4. The third light emitting layer LE3 includes the third well layer region WR3 and the third non-well layer region NR3 juxtaposed in the X-Y plane. The fourth light emitting layer LE4 includes the fourth well layer region WR4 and the fourth non-well layer region NR4 juxtaposed in the X-Y plane. The third cap layer CL3 is in contact with the third well layer region WR3 between the third well layer region WR3 of the third light emitting layer LE3 and the third barrier layer BL3. The fourth cap layer CL4 is in contact with the fourth well layer region WR4 between the fourth well layer region WR4 of the fourth light emitting layer LE4 and the fourth barrier layer BL4.

Thus, the light emitting part 30 can include N light emitting layers 32, N barrier layers 31, and N cap layers 35.

When "i" is not less than 2 and not more than N, the light emitting part 30 further includes the ith light emitting layer LEi, the ith barrier layer BLi, and an ith cap layer CLi. The ith light emitting layer LEi includes the ith well layer region WRi and the ith non-well layer region NRi. The ith well layer region WRi is provided between the (i−1) barrier layer BL(i−1) and the p-type semiconductor layer 20, juxtaposed in the plane perpendicular to the first direction, and contains In with an In composition ratio that is the same as the In composition ratio of the (i−1)th well layer region WR(i−1). The ith non-well layer region NRi has an In composition ratio lower than that in the ith well layer region WRi. The ith barrier layer BLi is provided between the ith light emitting layer LEi and the p-type semiconductor layer 20, and has a band gap energy larger than the band gap energy of the ith well layer region WRi. The ith cap layer CLi is in contact with the ith well layer region WRi between the ith well layer region WRi of the ith light emitting layer LEi and the ith barrier layer BLi.

At this time as well, the In composition ratio of the ith well layer region WRi is the same as the In composition ratio of the (i−1)th well layer region WR(i−1), which indicates that the wavelength band of the light emitted from the ith well layer region WRi is substantially the same as the wavelength band of the light emitted from the (i−1)th well layer region WR(i−1).

Thus, also in the semiconductor light emitting device 110a, regions where the well layer is provided (well layer regions 34) and regions where the well layer is not provided (non-well layer regions 33) are provided, in the face of the light emitting layers 32, and the well layers are divided in the X-Y plane, so even though the In composition ratio of the well layer regions 34 is 20% or higher, crystal defects are suppressed. As a result, a semiconductor light emitting device with a high luminous efficiency is obtained.

As discussed below, the cap layers 35 can be observed by TEM. However, it may be difficult to detect the cap layers 35, depending on the performance of the TEM.

Example

A semiconductor light emitting device according to an example of the first embodiment will be described.

Figure 3:
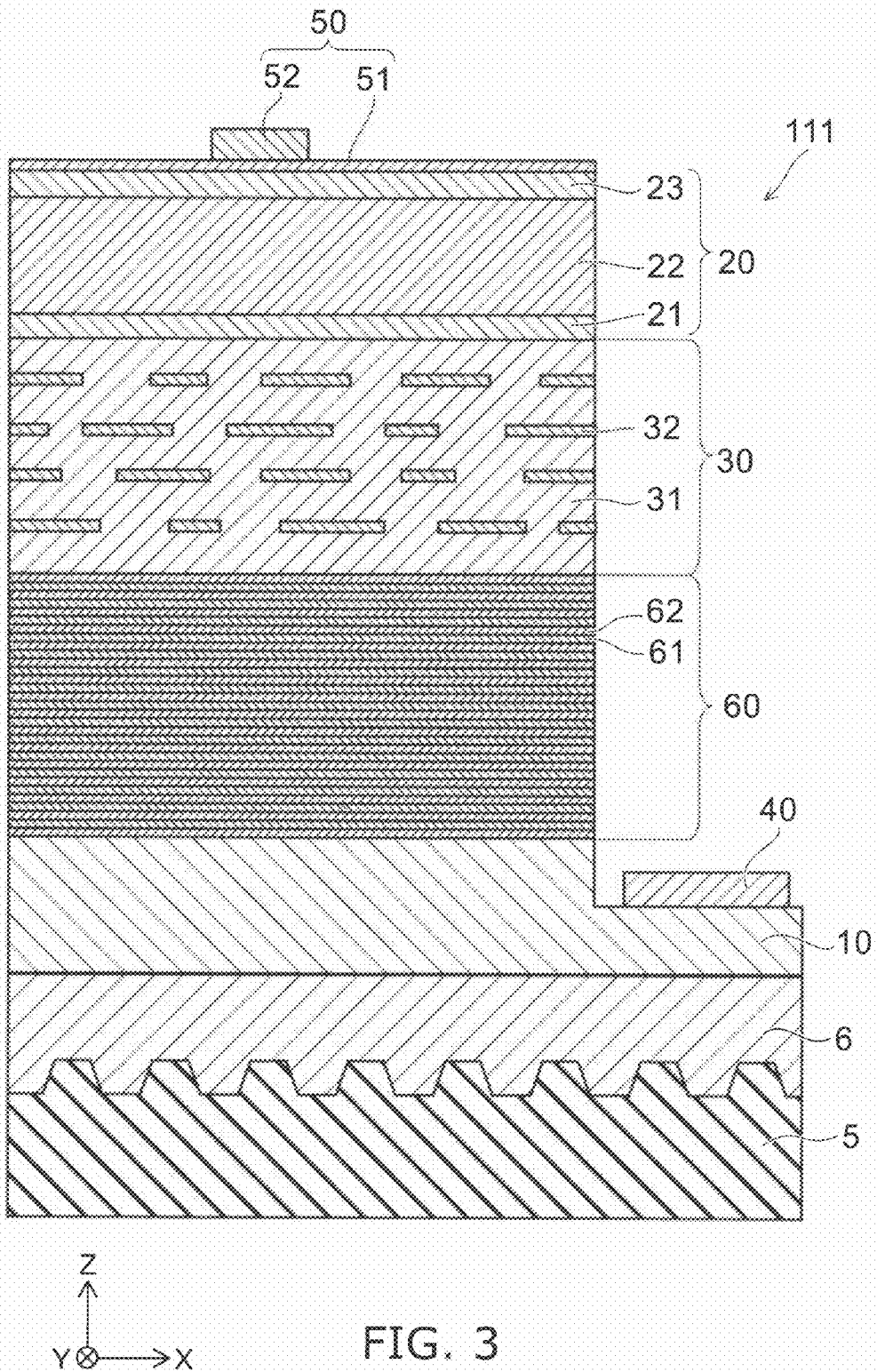
FIG. 3 is a schematic cross-sectional view illustrating the configuration of a semiconductor light emitting device according to an example.

FIG. 3 is a schematic cross-sectional view illustrating the configuration of the semiconductor light emitting device according to the example.

As illustrated in FIG. 3, a semiconductor light emitting device 111 according to the example includes, for example, a substrate 5. Sapphire, for example, is used for the substrate 5.

The top surface of the substrate 5 is processed to have an uneven shape. A buffer layer 6 is provided on the substrate 5. GaN, for example, is used for the buffer layer 6. An n-type semiconductor layer 10 is provided on the buffer layer 6. GaN doped with Si, for example, is used for the n-type semiconductor layer 10. The n-type semiconductor layer 10 constitutes an n-side contact layer.

A stacked film 60, for example, is provided on the n-type semiconductor layer 10. The stacked film 60 is, for example, a superlattice layer. The stacked film 60 includes a plurality of first layers 61 and a plurality of second layers 62 that are alternately stacked along the Z-axis direction. The first layer 61 is, for example, a GaN layer, and the second layer 62 is, for example, an $In_{0.07}Ga_{0.93}N$ layer. The number of first layers 61 is 21, and the number of second layers 62 is 20.

A light emitting part 30 is provided on the stacked film 60. The light emitting part 30 has the configuration as explained for FIG. 1A, FIG. 1B, FIG. 2A, and FIG. 2B. The number of light emitting layers 32 in the semiconductor light emitting device 111 is 8. However, in FIG. 3, four light emitting layers 32 are illustrated for simplicity. The n-side barrier layer BLn (not illustrated) is provided below the first light emitting layer LE1, which is closest to the n-type semiconductor layer 10 (closest to the stacked film 60). The eighth barrier layer BL8 (not illustrated) is provided above the eighth light emitting layer LE8, which is the uppermost light emitting layer.

The p-type semiconductor layer 20 is provided on the light emitting part 30. The p-type semiconductor layer 20 includes a first p-side layer 21 in contact with the light emitting part 30, a third p-side layer 23, and a second p-side layer 22 provided between the first p-side layer 21 and the third p-side layer 23. $Al_{0.1}Ga_{0.9}N$ doped with Mg, for example, is used for the first p-side layer 21. The first p-side layer 21 functions, for example, as an electron overflow suppression layer. GaN doped with Mg is used, for example, for the second p-side layer 22. GaN doped with Mg to a high concentration is used, for example, in the third p-side layer 23. The third p-side layer 23 constitutes a p-side contact layer.

A part of the n-type semiconductor layer 10 on the p-type semiconductor layer 20 is exposed, and an n-side electrode 40 that has an electrical connection with the n-type semiconductor layer 10 is provided. Furthermore, a p-side electrode 50 that has electrical connection with the p-type semiconductor layer 20 is provided. The p-side electrode 50 includes a p-side transparent electrode 51 provided on the p-type semiconductor layer 20 and a p-side conductive layer 52 provided on the p-side transparent electrode 51.

Hereinafter, an example of a method for manufacturing the semiconductor light emitting device 111 will be described. In the method for manufacturing the semiconductor light emitting device 111, a Metal Organic Chemical Vapor Deposition (MOCVD) apparatus, for example, is used to grow the crystals of the nitride semiconductor.

The substrate 5 is placed on the susceptor within the reaction chamber of the MOCVD apparatus. Next, hydrogen gas is introduced while maintaining the pressure within the reaction chamber at 500 Torr. Next, the substrate 5 is heated to 1100° C. and maintained for 10 minutes.

Next, the temperature of the substrate 5 is set to 500° C., and hydrogen gas that includes trimethylgallium gas (TMG) and $NH_3$ gas is introduced. Thereby, a lower layer buffer layer made from polycrystalline GaN is grown on the substrate 5. The thickness of the lower layer buffer layer is 20 nanometers (nm), for example.

Introduction of TMG gas is stopped, and the temperature of the substrate 5 is raised to 1050° C.

Then, by introducing hydrogen gas that includes TMG gas and $NH_3$ gas, an upper layer buffer layer made from GaN is grown. The thickness of the upper layer buffer layer is 2 micrometers (μm), for example. The lower layer buffer layer and the upper layer buffer layer described above correspond to the buffer layer 6.

Monosilane gas is introduced, and the n-type semiconductor layer 10 made from GaN doped with Si is grown on the buffer layer 6 (on the upper layer buffer layer).

Introduction of TMG gas and monosilane gas is stopped, the hydrogen gas is switched to nitrogen gas, and the temperature of the substrate 5 is set to 850° C.

Then, TMG gas is introduced, and the first layer 61 made from GaN is grown. The thickness of the first layer 61 is 3 nm, for example.

Thereafter, trimethylindium (TMI) gas is further introduced. Thereby, the second layer 62 is grown. The second layer 62 uses, for example, InGaN with an In composition ratio of 7% (7 atomic percent) among the group III elements. The thickness of the second layer 62 is 1 nm, for example.

Then, the combination of the first layer 61 and the second layer 62 is further grown by repeating a total of 19 times, and then a first layer 61 is further grown thereupon under the same conditions described above. Thereby, the stacked film 60 is formed by stacking the combination of the first layer 61 and the second layer 62 in 20 cycles.

Next, introduction of TMG gas is stopped, and the temperature of the substrate 5 is set to 800° C. Then, TMG gas is introduced, and a lower side barrier layer made from GaN is grown. The thickness of the lower side barrier layer is 6 nm, for example.

Next, introduction of TMG gas is stopped, and the temperature of the substrate 5 is set to 700° C. Then, TMG gas is introduced, and an upper side barrier layer made from GaN is grown. The thickness of the upper side barrier layer is 2 nm, for example.

The lower side barrier layer and the upper side barrier layer described above correspond to the n-side barrier layer BLn.

Thereafter, TMI gas is further introduced. Thereby, a base layer made from InGaN with an In composition ratio of 25% (25 atomic percent) among the group III elements is grown. The base layer is the layer that will become a light emitting layer 32 (the first light emitting layer LE1). The thickness of the base layer is 2.5 nm.

Thereafter, introduction of TMI is stopped, and a cap layer 35 made from GaN is formed. The cap layer 35 is formed to be non-uniform. Specifically, there are portions where the base layer is covered by the cap layer 35 and portions that are not covered by the cap layer 35. The cap layer 35 is island-like formed, for example. The cap layer 35 is provided in a mesh form, for example. The average thickness of the cap layer 35 is about 2 nm or less, for example.

Next, introduction of TMG gas is stopped, and the temperature of the substrate 5 is raised to 800° C. At this time, In is released from the portions of the base layer that are not covered by the cap layer 35, and the In composition ratio is reduced in these portions. In the portion of the base layer covered with the cap layer 35, it is difficult for the In to be released. Thereby, the portion of the base layer covered with the cap layer 35 becomes the well layer region 34, and the portion of the base layer not covered with the cap layer 35 becomes the non-well layer region 33. The In concentration in the non-well layer region 33 is reduced to about the same as that of the barrier layer 31.

Thereafter, TMG gas is introduced, and the barrier layer 31 (first barrier layer BL1) made from GaN is grown. The thickness of the first barrier layer BL1 is 6 nm, for example.

Then, the combination of the base layer, the cap layer 35, and the barrier layer 31 is further grown by repeating a total of seven times. Thereby, the light emitting part 30 with an 8-cycle multi quantum well structure is formed.

Introduction of TMG gas and TMI gas is stopped, and the temperature of the substrate 5 is raised to 1000° C.

Then, hydrogen gas that includes TMG gas, TMA gas, and $Cp_2Mg$ gas, together with $NH_3$ gas is introduced, and the first p-side layer 21 made from Mg doped $Al_{0.1}Ga_{0.9}N$ is grown.

Next, introduction of the TMA gas is stopped, and the second p-side layer 22 made from Mg doped GaN is grown, and thereafter, the $Cp_2Mg$ gas flow rate is adjusted, and the third p-side layer 23 is grown.

When the growth is complete, the substrate 5 is removed, the crystal stacked film, for example, is processed to a predetermined shape, the p-side electrode 50 that includes the p-side transparent electrode 51 and the p-side conductive layer 52, and the n-side electrode 40 are formed, and the semiconductor light emitting device 111 is manufactured.

Figure 4A:
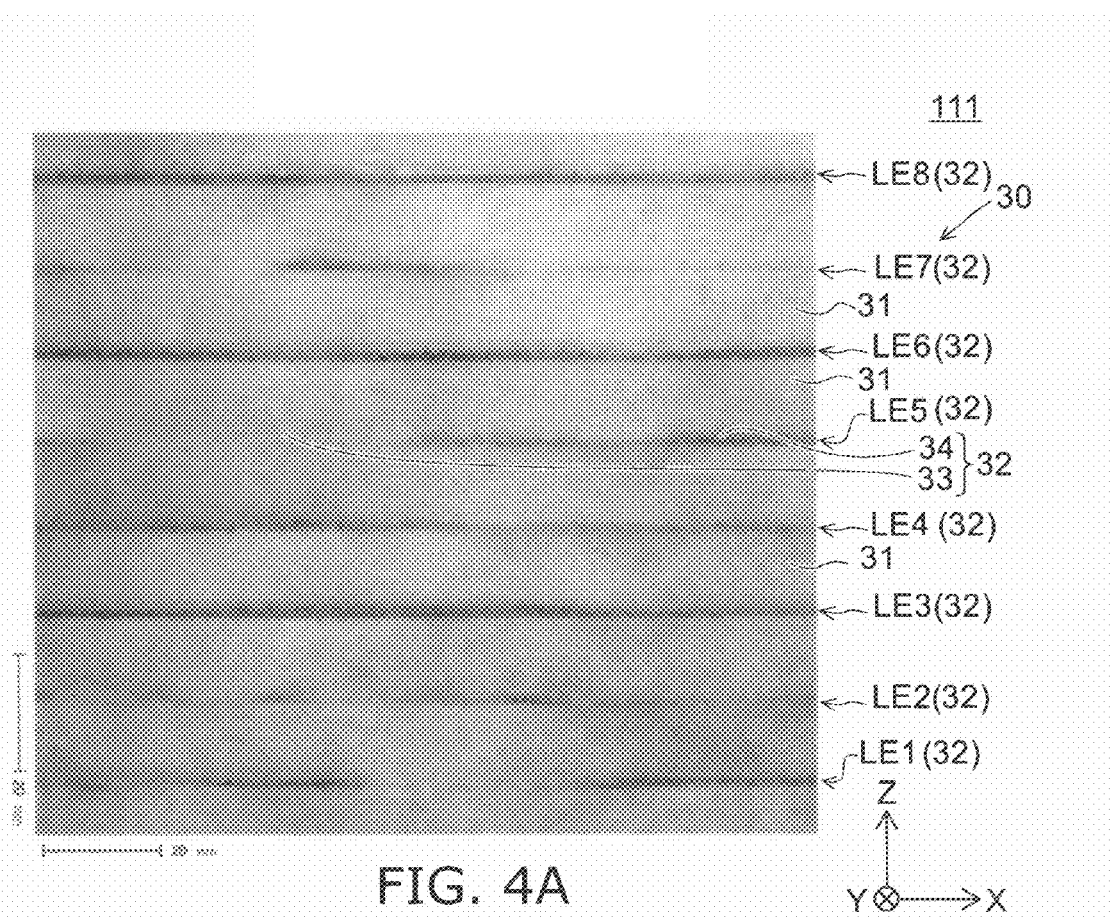
FIG. 4A and FIG. 4B are transmission electron microscope photographs illustrating the configurations of a semiconductor light emitting device according to the example.
Figure 4B:
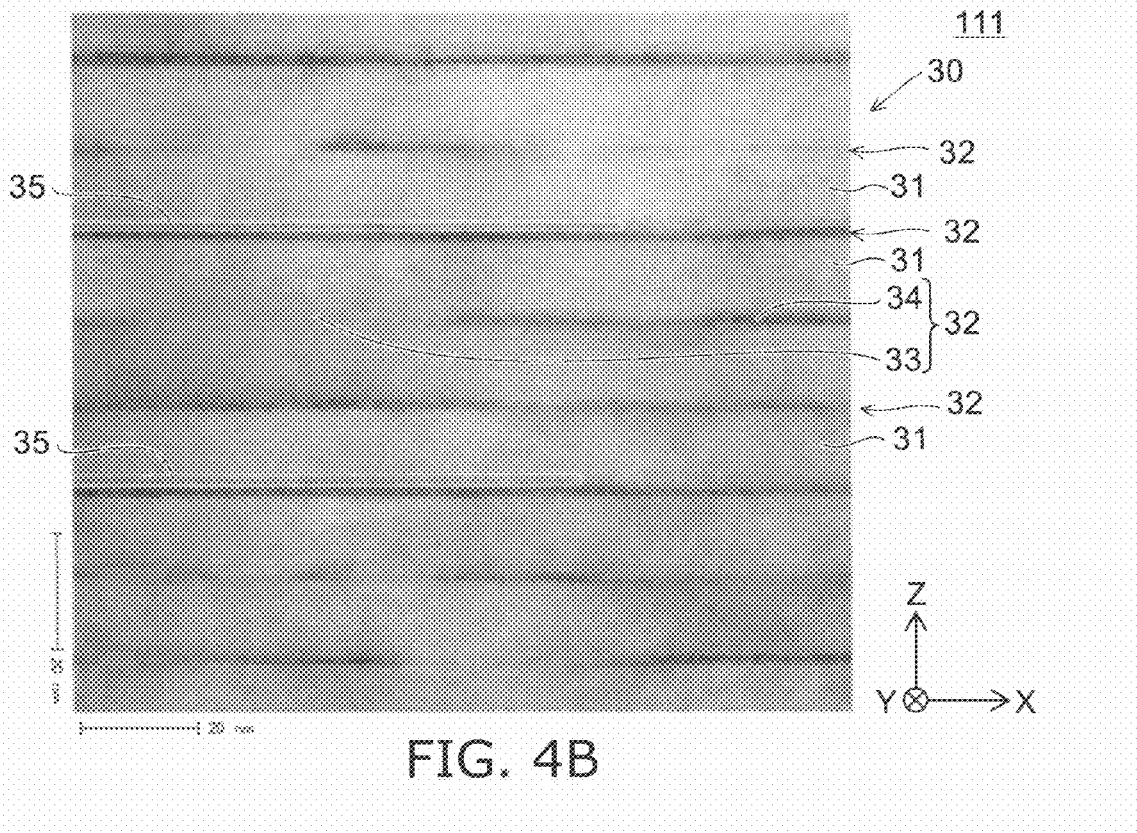

FIG. 4A and FIG. 4B are transmission electron microscope photographs illustrating the configuration of the semiconductor light emitting device according to the example.

FIG. 4A is a TEM photograph of the light emitting part 30 of the semiconductor light emitting device 111, and FIG. 4B is the TEM photograph of FIG. 4A with the contours of the cap layer 35 shown relatively clearly.

As illustrated in FIG. 4A, it can be seen that in the semiconductor light emitting device 111, in the portion (plane parallel to the X-Y plane) corresponding to the light emitting part 32, there are portions where the concentration of the photographic images is high and portions where the concentration is low. Between two light emitting layers 32, the concentration of the photographic images is low, and this portion corresponds to the barrier layer 31. In the portion corresponding to the light emitting layer 32 (plane parallel to the X-Y plane), the portion where the concentration of the photographic image is high corresponds to the well layer region 34, and the portion where the concentration is low corresponds to the non-well layer region 33. The concentration of the images in the portion corresponding to the non-well layer region 33 is low to about the same extent as the concentration of the images in the portion corresponding to the barrier layer 31.

Thus, in the semiconductor light emitting device 111, well layers that are continuous over the whole face of the light emitting layers 32 are not used, but well layer regions 34 and non-well layer regions 33 are provided in the face of the light emitting layer 32, and the well layer regions 34 are divided in the X-Y plane.

In this specific example, the portion where the concentration of the photographic images is low corresponds to the barrier layer 31 and the non-well layer region 33, and the portion where the concentration is high corresponds to the well layer region 34. However, depending on the TEM imaging conditions and the image processing conditions, the portion where the concentration of the photographic images is high could correspond to the barrier layer 31 and the non-well layer regions 33, and the portion where the concentration is low could correspond to the well layer regions 34. As long as the image concentrations of the well layer regions 34, where the In composition ratio is high, and the barrier layer 31 and the non-well layer regions 33, where the In composition ratio is lower than the well layer regions 34, are different, it will be possible to distinguish the well layer regions 34 from the barrier layer 31 and the non-well layer regions 33.

As illustrated in FIG. 4B, in the semiconductor light emitting device 111, the cap layer 35 is formed on the well layer regions 34. In the TEM photograph, the cap layer 35 can be clearly seen in the region where the concentration of the images is high corresponding to the well layer region 34. In this TEM photograph, the cap layer 35 cannot be seen in the portion (for example, the non-well layer region 33) where the image concentration is relatively low.

In the portion where the cap layer 35 can be clearly seen, the concentration of the portion corresponding to the well layer region 34 is high, and the well layer region 34 is clear. Conversely, in the portion where the cap layer 35 cannot be clearly seen, the concentration of the photograph images is low, the well layer region 34 is not provided, and the non-well layer region 33 is provided.

In the plurality of light emitting layers 32 stacked in the Z-axis direction, the positions in the X-Y plane where the well layer regions 34 are provided are mutually different. It is considered that the cap layers 35 formed on the base layers are formed in unspecified positions in unspecified shapes. The well layer regions 34 and the non-well layer regions 33 are formed depending on the presence or absence of the cap layer 35, so it is considered that the well layer regions 34 and the non-well layer regions 33 are formed in unspecified positions in the X-Y plane.

However, the well layer regions 34 and the non-well layer regions 33 are juxtaposed on the X-Y plane. Specifically, well layer regions 34 and non-well layer regions 33 are formed in planes in the same position in the Z-axis direction. This is because the well layer regions 34 and the non-well layer regions 33 are formed based on the base layers.

Figures 5, 6:
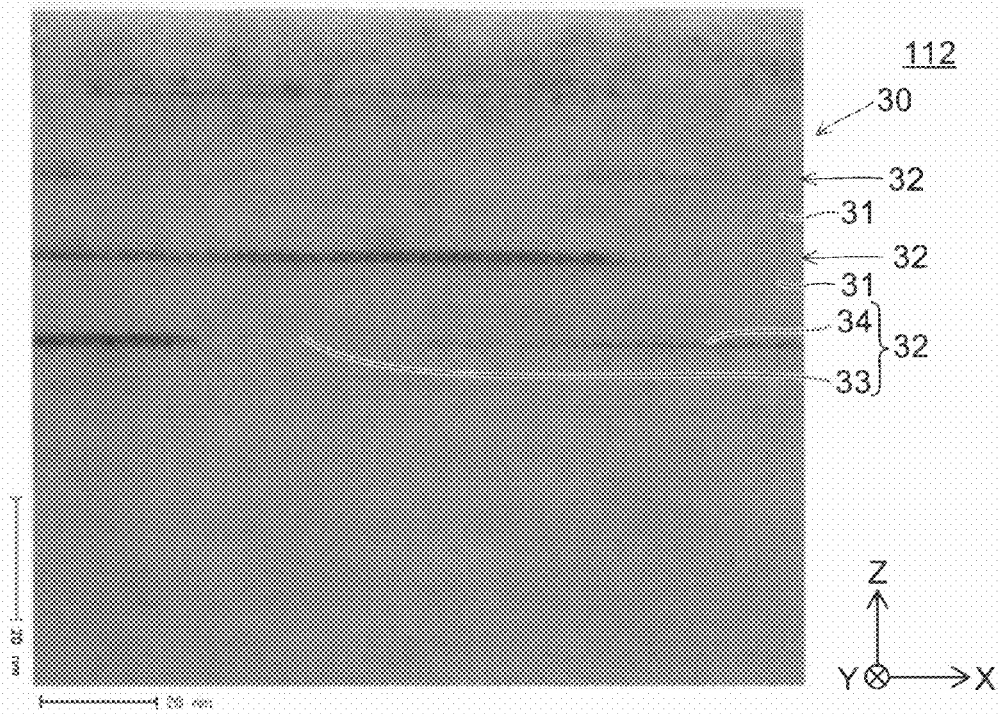
FIG. 5 is a table illustrating the configuration of the semiconductor light emitting device according to the example.
FIG. 6 is a transmission electron microscope photograph illustrating the configuration of another semiconductor light emitting device according to the example.

FIG. 5 is a table illustrating the configuration of the semiconductor light emitting device according to the example.

Specifically, this figure shows the maximum value tmax and the minimum value tmin of the thickness of the well layer regions 34 in each of the light emitting layers 32 (the first to eighth light emitting layers LE1 to LE8) in the semiconductor light emitting device 111, which are read from the TEM photographs of FIG. 4A and FIG. 4B.

As illustrated in FIG. 5, the maximum value tmax of the thickness of the well layer regions 34 in the first light emitting layer LE1 to the eighth light emitting layer LE8, ranges from 1.9 nm through 2.5 nm. On the other hand, in the first light emitting layer LE1 to the eighth light emitting layer LE8, there are cases where the minimum value tmin of the thickness of the well layer regions 34 is zero (0). Specifically, in the second light emitting layer LE2, the fifth light emitting layer LE5, and the seventh light emitting layer LE7, the minimum value tmin of the thickness of the well layer regions 34 is zero (0). The portion where the minimum value tmin of the thickness of the well layer regions 34 is zero (0) corresponds not to the well layer regions 34, but to the non-well layer regions 33. In other words, in this specific example, in the second light emitting layer LE2, the fifth light emitting layer LE5, and the seventh light emitting layer LE7, well layer regions 34 and non-well layer regions 33 are provided.

Thus, in the case where a plurality of light emitting layers 32 is provided, both well layer regions 34 and non-well layer regions 33 are formed in at least one of the plurality of light emitting layers 32.

FIG. 6 is a transmission electron microscope photograph illustrating the configuration of another semiconductor light emitting device according to the example.

FIG. 6 is a TEM photograph of the light emitting part 30 of another semiconductor light emitting device 112 according to the example of the first embodiment.

The semiconductor light emitting device 112 was manufactured by modifying in part the manufacturing conditions of the semiconductor light emitting device 111. In the semiconductor light emitting device 112 as well, well layers that are continuous over the whole face of the light emitting layers 32 are not used, but well layer regions 34 and non-well layer regions 33 are provided in the face of the light emitting layer 32, and the well layer regions 34 are divided in the X-Y plane. In the semiconductor light emitting device 112, the proportion of non-well layer regions 33 is larger than that of the semiconductor light emitting device 111.

In the semiconductor light emitting device according to this embodiment, the proportions of well layer regions 34 and non-well layer regions 33 can be varied.

Figure 7:
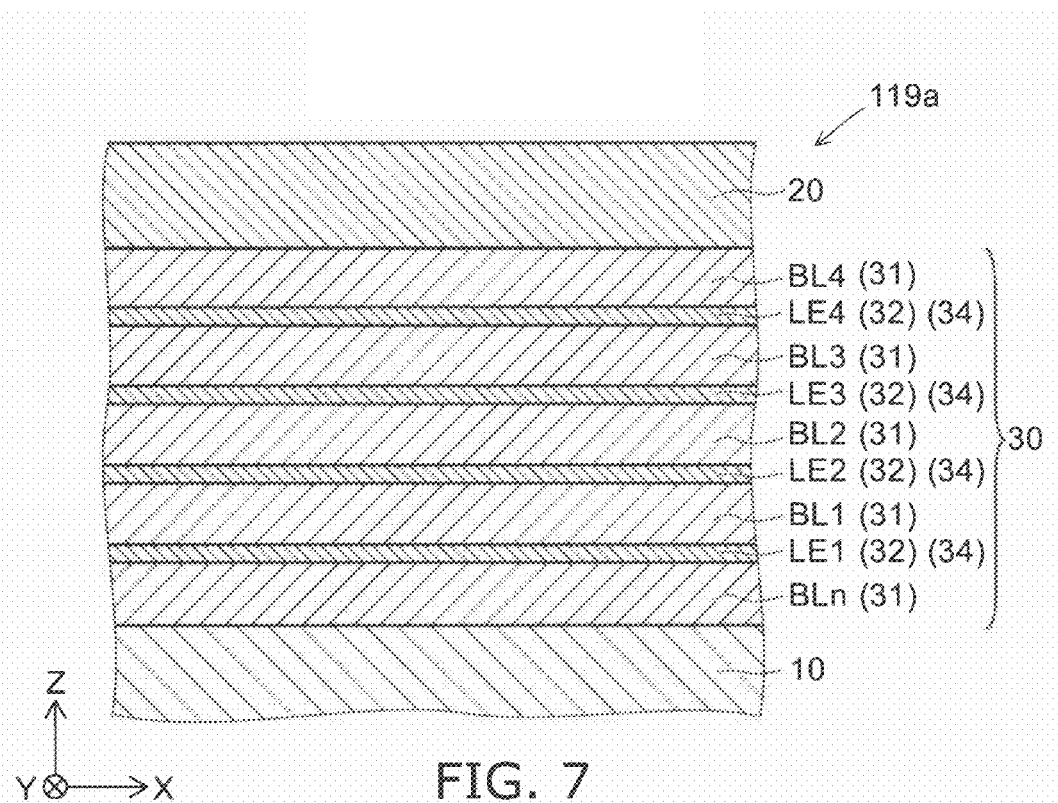
FIG. 7 is a schematic cross-sectional view illustrating the configuration of a semiconductor light emitting device of a reference example.

FIG. 7 is a schematic cross-sectional view illustrating the configuration of a semiconductor light emitting device of a reference example.

As illustrated in FIG. 7, in a semiconductor light emitting device 119a of a first reference example, the entire surfaces of the light emitting layers 32 are the well layer regions 34. In other words, in the semiconductor light emitting device 119a, well layers (light emitting layers 32) are provided across the whole face in the X-Y plane. In the semiconductor light emitting device 119a as well, the In composition ratio of the light emitting layers 32 is 25%. The other conditions are the same as the semiconductor light emitting device 111.

In this semiconductor light emitting device 119a, cap layers 35 are not provided, and the semiconductor light emitting device 119a is manufactured by forming the barrier layer 31 on the whole face of the base layer (the layer that becomes the light emitting layer 32). In other words, the In in the base layer is intercepted by the barrier layer 31 that covers the whole face of the base layer, so the In is not released from the base layer. Thereby, a well layer (light emitting layer 32) is formed over the whole face of the X-Y plane.

Figure 8:
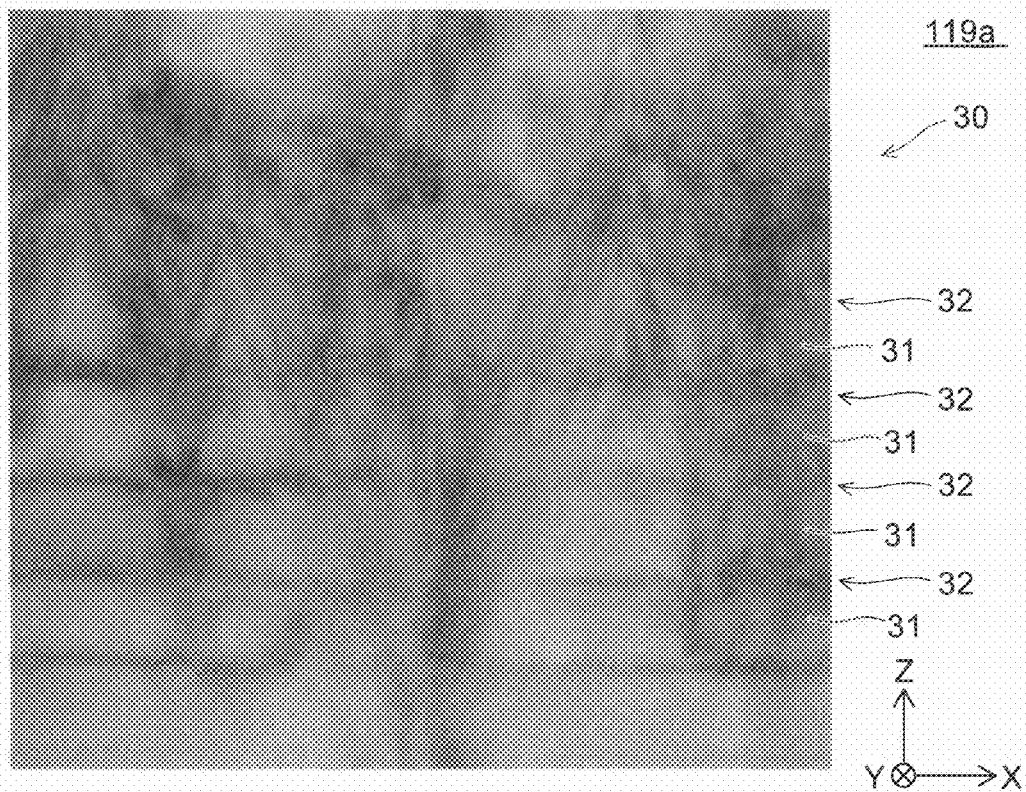
FIG. 8 is a transmission electron microscope photograph illustrating the configuration of the semiconductor light emitting device of the reference example.

FIG. 8 is a transmission electron microscope photograph illustrating the configuration of the semiconductor light emitting device of the reference example.

As illustrated in FIG. 8, in the semiconductor light emitting device 119a, a defect has occurred in the crystal of the light emitting part 30. In the semiconductor light emitting device 119a, the well layer (light emitting layer 32) is provided continuously over the whole face, so lattice strain caused by lattice mismatch in the well layer (light emitting layer 32) can easily occur. The crystal quality of the light emitting layer 32 is degraded by this lattice strain. Degradation of crystal quality occurs during crystal growth of the light emitting layer 32, as well as when crystal growth is completed, and occurs, for example, due to the various stresses during the processes of forming electrodes, and so on.

Crystal defects can easily occur in this way in the case where the In composition ratio of the well layers of the light emitting layers 32 is 20% or higher, and the light emitting layer 32 is continuous across the whole face in the X-Y plane.

Figure 9:
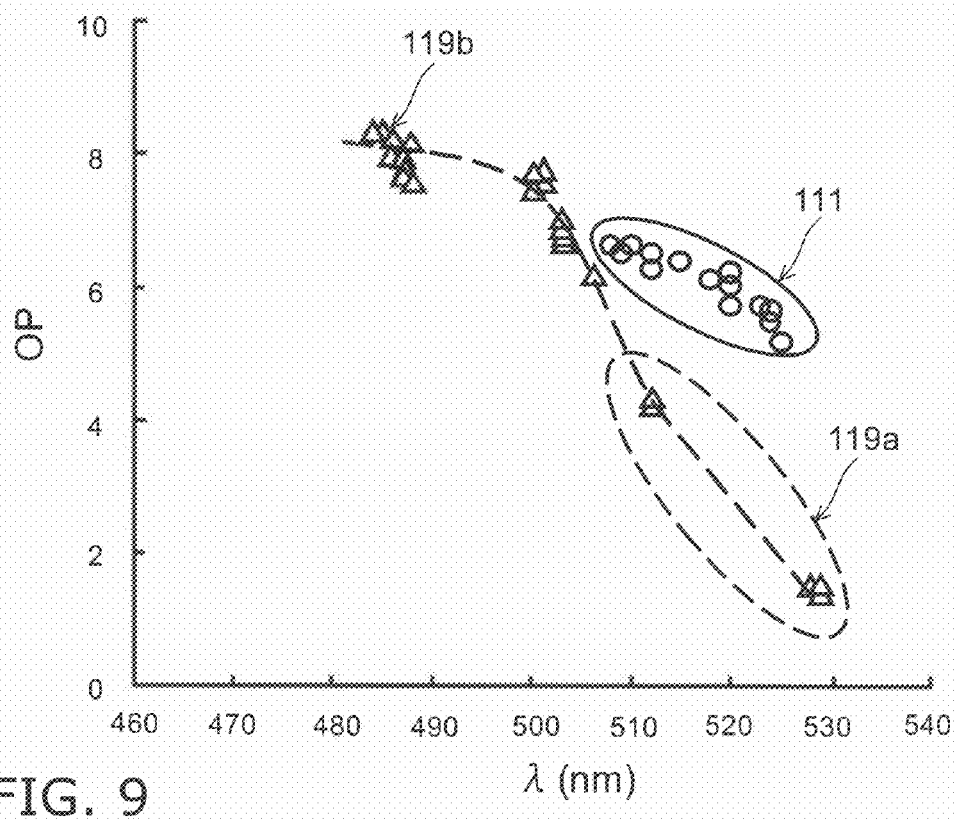
FIG. 9 is a graph illustrating the characteristics of semiconductor light emitting devices.

FIG. 9 is a graph illustrating the characteristics of semiconductor light emitting devices.

This graph shows the results for the main wavelength (peak wavelength) and output power of the light emitted measured on test specimens that were produced by varying the In composition ratio of the light emitting layer 32. The graph shows the results for semiconductor light emitting devices of the reference example in which the well layer region of the light emitting layer 32 is continuous over the whole face in the X-Y plane, and semiconductor light emitting devices of the example in which well layer regions 34 and non-well layer regions 33 are provided in the light emitting layers 32. The horizontal axis of the graph is the wavelength λ of the emitted light, and the vertical axis of the graph is the light output power OP when there is a current of 20 milliampere (mA).

As illustrated in FIG. 9, in the semiconductor light emitting device 119b of the second reference example, in which the well layer region of the light emitting layer 32 is continuous over the whole face in the X-Y plane, when the wavelength λ is about 500 nm or less, the light output power OP is large. However, in the case where the well layer region of the light emitting layer 32 is continuous over the whole face in the X-Y plane, the light output power OP decreases significantly when the wavelength λ is longer than 500 nm. In the semiconductor light emitting device 119a of the first reference example with a wavelength λ longer than 500 nm, the light output power OP is less than half that of the semiconductor light emitting device 119b of the second reference example with a wavelength λ not longer than about 500 nm.

On the other hand, in the semiconductor light emitting device 111 according to the example having well layer regions 34 and non-well layer regions 33 in the light emitting layers 32, it can be seen that a high value of light output power OP is maintained in the region where the wavelength λ is longer than 500 nm.

This phenomenon was newly discovered using the tests carried out by the inventors.

The light emitting part 30 is formed on, for example, a base material layer such as GaN (for example, the n-type semiconductor layer 10, or the like). In the light emitting layers 32 of the light emitting part 30, In is added to the GaN so that light with the desired wavelength is emitted. By adding In to the GaN, the lattice mismatch between the GaN base material layer and the well layers that contain In is increased, so crystalline defects can easily occur in the well layers.

For a wavelength of blue light, the In composition ratio of the well layer in the light emitting layer 32 is about from 13% to 18%, but for a wavelength of green light, the In composition ratio of the well layer of the light emitting layer 32 is about from 20 to 28%. Therefore, in a semiconductor light emitting device that emits light with a green wavelength, the lattice mismatch is particularly great, and crystal defects can occur particularly easily. The wavelength of light emitted from a well layer with an In composition ratio not lower than 20% and not higher than 28% is in the range not shorter than 500 nm and not longer than 560 nm.

The reason why the output power OP in the reference examples, where the well layer region is continuous over the whole face of the light emitting layer 32 in the X-Y plane, is significantly reduced when the wavelength is longer than 500 nm (semiconductor light emitting device 119a of the first reference example) compared with when the wavelength is not longer than about 500 nm (semiconductor light emitting device 119b of the second reference example), as illustrated in FIG. 9, is considered to be because the lattice mismatch increases as the In composition ratio decreases, and as a result crystal defects occur as illustrated in FIG. 8, so the light emission power is greatly reduced.

On the other hand, in the semiconductor light emitting device 111, the well layer regions 34 and the non-well layer regions 33 are provided in the light emitting layers 32, so the lattice strain can be easily eased, so the crystal quality is high, and as a result it is considered that the reduction in light output is suppressed.

The configuration of semiconductor light emitting devices 110 and 110a according to this embodiment (semiconductor light emitting device 111, and the like) were constructed based on these experimental facts which were first discovered by the inventors.

Specifically, well layers that are continuous over the whole face of the light emitting layer 32 are not used, but well layer regions 34 and regions where a well layer is not provided (non-well layer region 33) are provided in the face of the light emitting layers 32, and the well layers (well layer regions 34) are divided in the X-Y plane. Therefore, it is difficult for crystal defects to occur in the light emitting layer 32. Thereby, even though the In composition ratio of the well layer regions 34 is 20% or higher for green light, crystal defects are suppressed, so as a result a semiconductor light emitting device with a high luminous efficiency is obtained.

Figure 10:
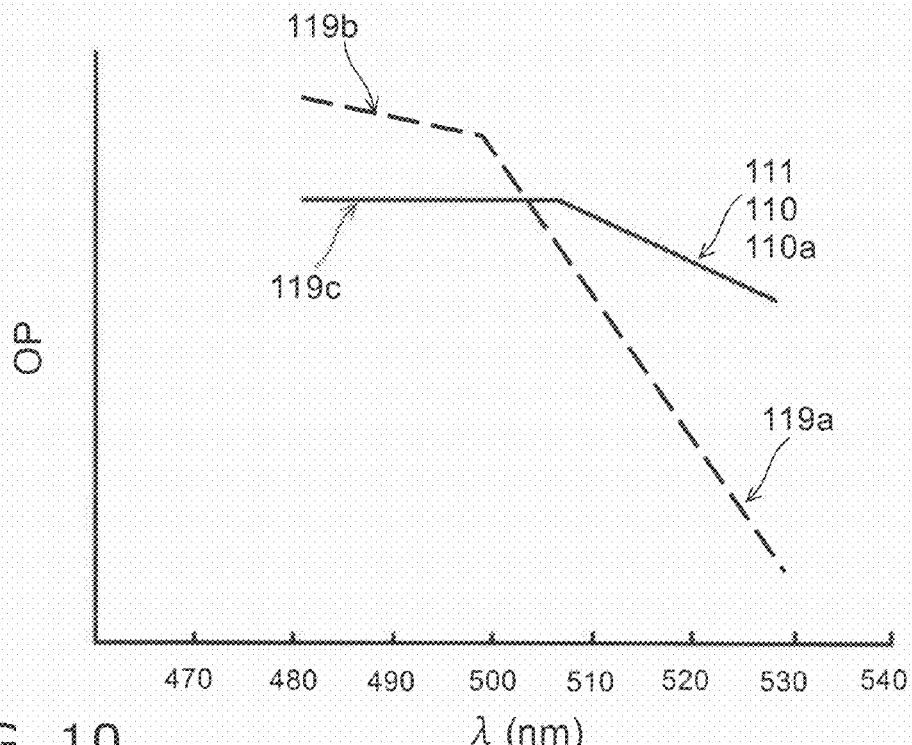
FIG. 10 is a graph illustrating the characteristics of semiconductor light emitting devices.

FIG. 10 is a graph illustrating the characteristics of semiconductor light emitting devices.

The graph shows the results for semiconductor light emitting devices in which well layer regions 34 and non-well layer regions 33 are provided in the light emitting layer 32 (solid line) and semiconductor light emitting devices in which the non-well layer regions 33 are not provided and the well layer region is continuous over the whole face of the light emitting layer 32 in the X-Y plane (broken line).

As shown by the broken line in FIG. 10, in the case where non-well layer regions 33 are not provided and the well layer region is continuous over the whole face of the light emitting layer 32 in the X-Y plane, when the wavelength λ is short and the In composition ratio of the well layer is low (semiconductor light emitting device 119b of the second reference example), lattice mismatch is small so the crystal quality is high, and the light output power OP is high. However, when the wavelength λ is long and the In composition ratio of the well layer is high (semiconductor light emitting device 119a of the first reference example), the lattice mismatch is great and the crystal quality is low, and the light output power OP is significantly reduced.

On the other hand, as shown by the solid line in FIG. 10, in the case where the well layer regions 34 and non-well layer regions 33 are provided in the light emitting layer 32 and the wavelength λ is short and the In composition ratio of the well layer regions 34 is low (semiconductor light emitting device 119c of a third reference example), the lattice mismatch is small and the crystal quality is high, but the area ratio of the well layer regions 34 on the X-Y plane is low. Therefore, it is considered that the light output power of the semiconductor light emitting device 119c of the third reference example is lower than that of the semiconductor light emitting device 119b of the second reference example.

Therefore, it is considered that for In composition ratios where the lattice mismatch is small, the method of dividing the well layers was not used.

On the other hand, in the case where the well layer regions 34 and non-well layer regions 33 are provided in the light emitting layer 32 and the wavelength λ is long and the In composition ratio of the well layer regions 34 is high (semiconductor light emitting device 110 and 110a according to this embodiment), the light output power OP is reduced to a certain extent by the low area ratio of the well layer regions 34 in the X-Y plane, but the lattice strain is small and the crystal quality is high. Therefore, the light output power of the semiconductor light emitting device 111 (semiconductor light emitting devices 110 and 110a) is higher than the semiconductor light emitting device 119a of the first reference example.

Thus, in the case where the In composition ratio is such that the lattice mismatch is great, the merit that the crystal quality is high is greater than the demerit that the area ratio of the well layer regions 34 is low as a result of dividing the well layers. In this way a high luminous efficiency can be obtained even with long wavelengths.

Figure 11A:
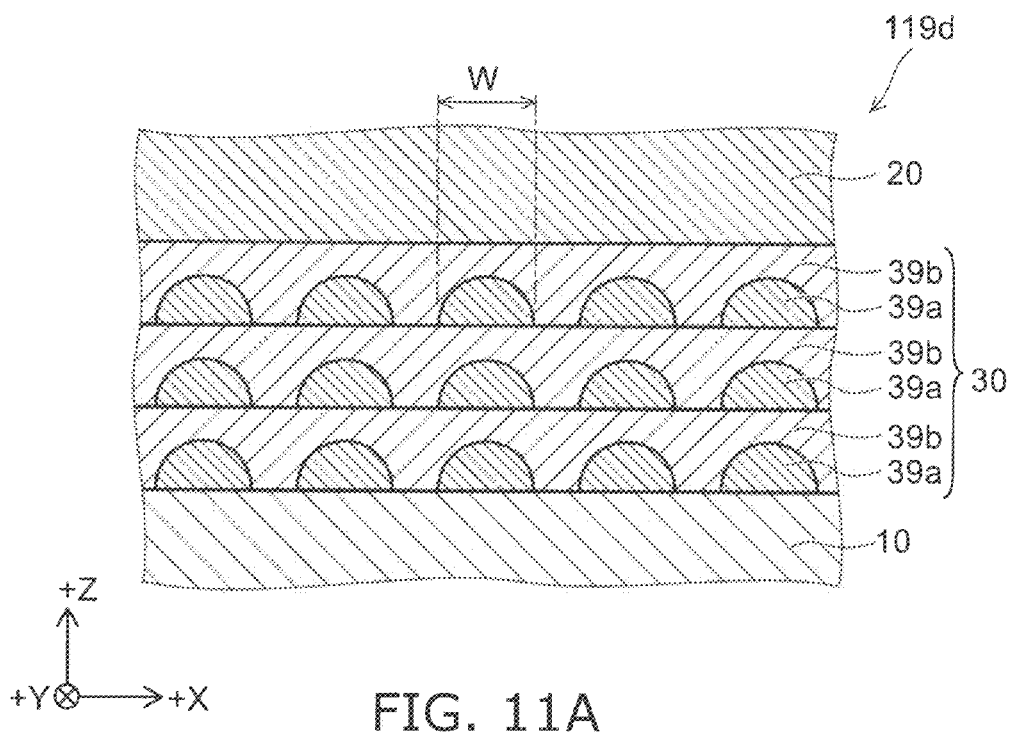
FIG. 11A and FIG. 11B are schematic cross-sectional views illustrating the configurations of semiconductor light emitting devices of the reference example.
Figure 11B:
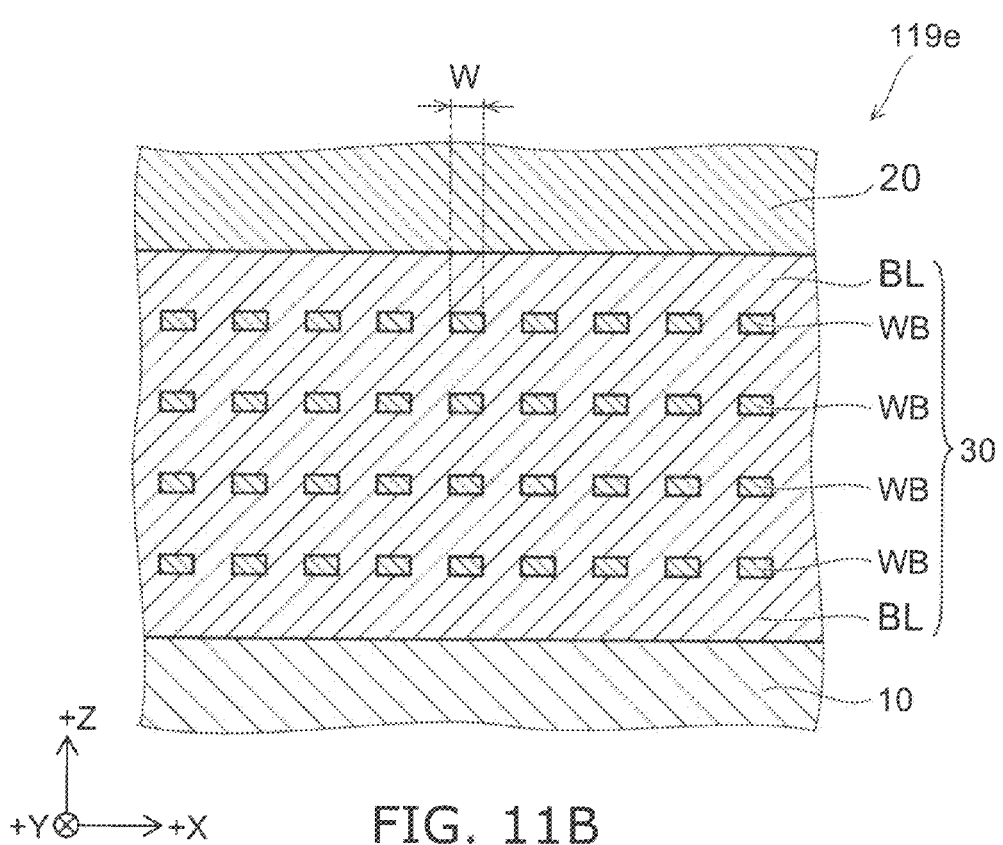

FIG. 11A and FIG. 11B are schematic cross-sectional views illustrating the configurations of semiconductor light emitting devices of reference examples.

As illustrated in FIG. 11A, in the light emitting part 30 of a semiconductor light emitting device 119d of a fourth reference example, island-like crystals 39a are provided. The island-like crystals 39a can be formed on the n-type semiconductor layer 10 (cladding layer) that will become the base material by forming with a different lattice constant from that of the base material using the MOCVD method. Also, a structure in which a base layer 39b is formed over the island-like crystals 39a and island-like crystals 39a are further formed thereupon is known. The average diameter of the island-like crystals 39a is 5 nm to 30 nm (the average diameter on the bottom face of the island-like crystals 39a). Also, a configuration wherein white light is generated by varying the wavelength of the light emitted from each island-like crystal located on each stacked stage is known. By varying the size (the width along the X-Y plane) of the island-like crystals, light with different wavelengths is obtained from the island-like crystals. Specifically, in this configuration, the quantum effect is used in the island-like crystals.

As illustrated in FIG. 11B, in the light emitting part 30 of a semiconductor light emitting device 119e of a fifth reference example, a plurality of well boxes WB is dispersed throughout the barrier layer BL. The well boxes WB are quantum boxes. For example, the width W of the well box WB along the X-Y plane is about 10 nm, the thickness is 5 nm, and the well boxes WB are cuboid. The gap between well boxes WB is 10 nm, for example. In the light emitting part 30, the well boxes WB are dispersed with regularity. In this type of the well box WB, it is possible to form the layer that will become the well box WB and the barrier layer BL by control of the lattice constant. By using the well boxes WB, it is possible to enclose the carrier in three-dimensions, and increase the luminous efficiency.

In the semiconductor light emitting device 119d of the fourth reference example and the semiconductor light emitting device 119e of the fifth reference example, island-like crystals 39a or the well boxes WB can be used to obtain the quantum effect. Therefore, in the semiconductor light emitting device 119d, the average diameter (width W along the X-Y plane) of the island-like crystals 39a is set to a relatively small value such as 5 nm to 30 nm so that the quantum effect is significantly displayed. Moreover, in the semiconductor light emitting device 119d, the width W of the well boxes WB along the X-Y plane is set to a relatively small value such as about 10 nm so that the quantum effect is distinctly obtained.

On the other hand, in the semiconductor light emitting devices 110 and 110a according to this embodiment (for example, semiconductor light emitting device 111 and the like), reduction in crystal quality due to lattice mismatch in the light emitting layer 32 is suppressed by providing the well layer regions 34 and the non-well layer regions 33. Therefore, the quantum effect is not necessary in the well layer regions 34 in the X-Y plane. The width W of the well layer regions 34 in the X-Y plane is arbitrary, and may be a size such that the quantum effect is not obtained. The well layer regions 34 have portion with a width W in the X-Y plane of 50 nm or more. For example, at least one of the first well layer region WR1 and the second well layer region WR2 have a portion with a width along a direction perpendicular to the Z-axis direction of 50 nm or more.

In configurations that use quantum dots or quantum boxes, such as the island-like crystals or the well boxes, the wavelength of the emitted light is shortened by the quantum effect. Therefore, in order to obtain the target wavelength of the emitted light (for example, green wavelength), the In composition ratio is set higher. The higher the In composition ratio the lower the crystal quality tends to be, so the luminous efficiency of configurations using quantum dots or quantum boxes can easily be reduced.

On the other hand, in this embodiment, the quantum effect is not necessary in the X-Y plane, so shortening of the wavelength of the emitted light is suppressed. Therefore, the In composition ratio can be set lower compared with cases where the quantum effect is used. Thereby, high crystal quality can be obtained, and as a result the luminous efficiency is high.

In a configuration wherein a plurality of well layers that is continuous across the whole face is stacked, and the light emission color of each well layer is varied in order to obtain white light, the light is mainly emitted from well layers with high luminous efficiency and in well layers with low luminous efficiency light is not substantially emitted, so the desired white light is not obtained. Therefore, an effort to obtain white light from a configuration wherein any of the well layers is a plurality of quantum dots or crystallites is known. In other words, a configuration is known wherein the well layers for the long wavelengths are discontinuous, and the well layers for the long wavelengths are made from a plurality of quantum dots or crystallites in order to increase the current injection efficiency to the well layers for the short wavelengths. Also, a configuration is known wherein island-like crystals having differing wavelengths are used, as in the semiconductor light emitting device 119d as described above.

On the other hand, in the semiconductor light emitting devices 110 and 110a according to this embodiment (for example, semiconductor light emitting device 111 and the like), the color of the light emitted from the plurality of light emitting layers 32 may be the same color. Specifically, in the semiconductor light emitting devices 110 and 110a according to this embodiment, the well layer regions 34 and the non-well layer regions 33 are provided in the light emitting layer 32 for the purpose of suppressing lattice strain in the light emitting layer 32, not for the purpose using a plurality of light colors like red, blue, and green, or mutually complementary colors to obtain white light.

Therefore, the In composition ratio of the well layer regions 34 in each of a plurality of light emitting layers 32 to be stacked is substantially the same. Specifically, the In composition ratio of the second well layer region WR2 is substantially the same as the In composition ratio of the first well layer region WR1. However, as already explained, it is sufficient that the color of the light emitted from the second well layer region WR2 and the color of the light emitted from the first well layer region WR1 are the same color. The In composition ratio of the second well layer region WR2 is about plus or minus 20% or lower of the In composition ratio of the first well layer region WR1. Thereby, the color of the light emitted from the second well layer region WR2 may be the same as the color of the light emitted from the first well layer region WR1.

A configuration is known wherein activation annealing is carried out to grow the p-type semiconductor layer, then the light emitting layer of the island-like crystals is grown, and the n-type semiconductor layer is grown. In this configuration, there is significant thermal degradation of the island-like crystals, so to avoid the thermal degradation of the light emitting layer, growing the island-like crystals (light emitting layer) is carried out after growing the p-type semiconductor layer and carrying out the activation annealing.

On the other hand, in the semiconductor light emitting devices 110 and 110a according to this embodiment, after forming the n-type semiconductor layer 10, the light emitting layer 32 that includes the well layer regions 34 is formed. In the semiconductor light emitting devices 110 and 110a according to this embodiment, degradation of crystal quality by heat, for example, is suppressed by providing the well layer regions 34 and the non-well layer regions 33 in the light emitting layer 32.

In the semiconductor light emitting devices 110 and 110a according to this embodiment, preferably the proportion of the area of the light emitting layer 32 occupied by the non-well layer regions 33 is higher than 30%. If the proportion of the area of the light emitting layer 32 occupied by the non-well layer regions 33 is 30% or less, the effect of suppressing the lattice strain by providing the non-well layer regions 33 becomes smaller. Preferably the proportion of the area of the light emitting layer 32 occupied by the non-well layer regions 33 is higher than or equal to 50%.

In the case where a plurality of light emitting layers 32 is provided, in at least one of the plurality of light emitting layers 32, it is sufficient that the proportion of the area of the light emitting layer 32 occupied by the non-well layer regions 33 is higher than 30%. Also, in at least one of the plurality of light emitting layers 32 the proportion of the area of the light emitting layer 32 occupied by the non-well layer regions 33 is preferably higher than or equal to 50%.

The proportion of the area of the light emitting layer 32 of the non-well layer regions 33 can be measured by, for example, TEM photographing, and the like as illustrated in FIG. 4A, FIG. 4B, and FIG. 5.

Specifically, in the TEM image, a value corresponding to the proportion of the area of the light emitting layer 32 of the non-well layer regions 33 can be calculated from the ratio of the length of the non-well layer regions 33 along the X-axis direction (or the Y-axis direction) to the length of the entire body (the light emitting layer 32) along the X-axis direction (or the Y-axis direction).

For example, the length along a second direction (for example, the X-axis direction or the Y-axis direction) perpendicular to the Z-axis direction of at least one of the first non-well layer region NR1 and the second non-well layer region NR2 is preferably longer than 30% of the above-described length along the second direction of the first light emitting layer LE1 or the second light emitting layer LE2. More preferably the length along the second direction perpendicular to the Z-axis direction of at least one of the first non-well layer region NR1 and the second non-well layer region NR2 is 50% of the length along the second direction of the first light emitting layer LE1 or the second light emitting layer LE2 or longer.

A configuration wherein the film thicknesses of the well layers are made non-uniform in an attempt to increase the luminous efficiency (sixth reference example) is known. However, in this case if there are regions where the film thickness of the well layers is 0 then the light output power is reduced, so it is known that there should be few regions of the well layers whose film thickness is 0. In such a sixth reference example, it is known that, for example, preferably the proportion of regions of the well layers where the film thickness is 0 is 30% or less of the total well layers, and more preferably 20% or less, and most preferably 10% or less.

On the other hand, in the semiconductor light emitting device 110 and 110a according to this embodiment, unlike the sixth reference example, by providing the non-well layer regions 33 to higher than a certain proportion, the occurrence of lattice strain under particular conditions where the lattice mismatch is great is suppressed.

Second Embodiment

Figure 12:
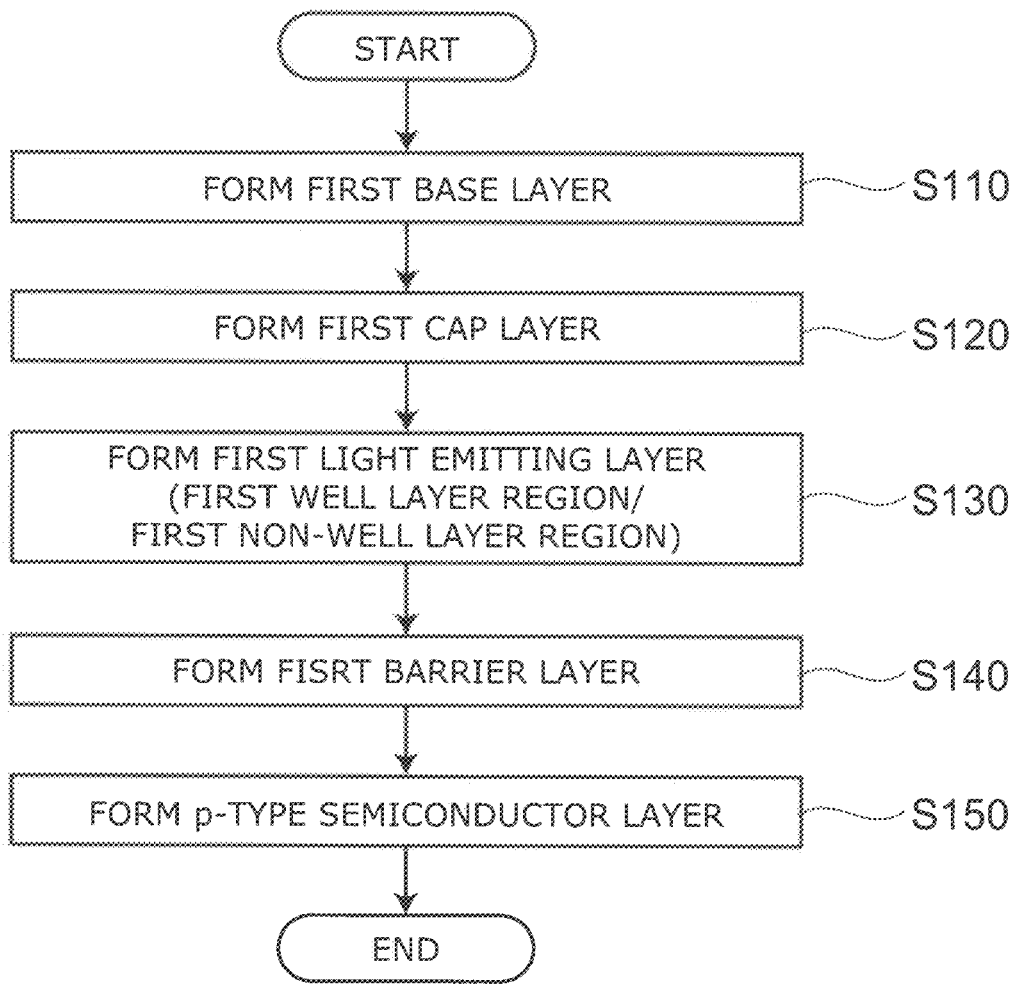
FIG. 12 is a flowchart illustrating a method for manufacturing a semiconductor light emitting device according to a second embodiment.

FIG. 12 is a flowchart illustrating a method for manufacturing a semiconductor light emitting device according to a second embodiment.

FIG. 13A to FIG. 13D are schematic cross-sectional views of processes, illustrating the method for manufacturing a semiconductor light emitting device according to the second embodiment.

Figure 13A:
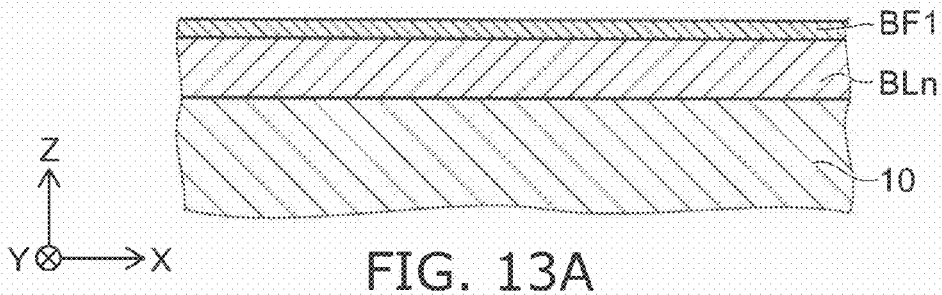
FIG. 13A to FIG. 13D are schematic cross-sectional views of processes, illustrating the method of manufacturing the semiconductor light emitting device according to the second embodiment.

As illustrated in FIG. 12 and FIG. 13A, in the method for manufacturing a semiconductor light emitting device according to second embodiment, a first base layer BF1 that includes a nitride semiconductor that contains In is formed on a n-type semiconductor layer 10 (Step S110).

In the specification of this application, the term "a layer is formed on" includes forming an upper layer directly on a base material layer, as well as forming another layer on the base material layer, and forming the upper layer on the other layer.

In the example illustrated in FIG. 13A, an n-side barrier layer BLn (for example a GaN layer) is formed on the n-type semiconductor layer 10, and the first base layer BF1 is formed on the n-side barrier layer BLn. Furthermore, as explained for the semiconductor light emitting device 111 and the method for manufacturing the same according to the example, a stacked film 60 (for example, a superlattice layer) can be formed on the n-type semiconductor layer 10, the n-side barrier layer BLn can be formed on the stacked film 60, and the first base layer BF1 can be formed on the n-side barrier layer BLn.

The first base layer BF1 is grown from crystals made from InGaN with an In composition ratio of 25%, for example. The thickness of the first base layer BF1 is not less than 2.0 nm and not more than 5.0 nm.

Figure 13B:
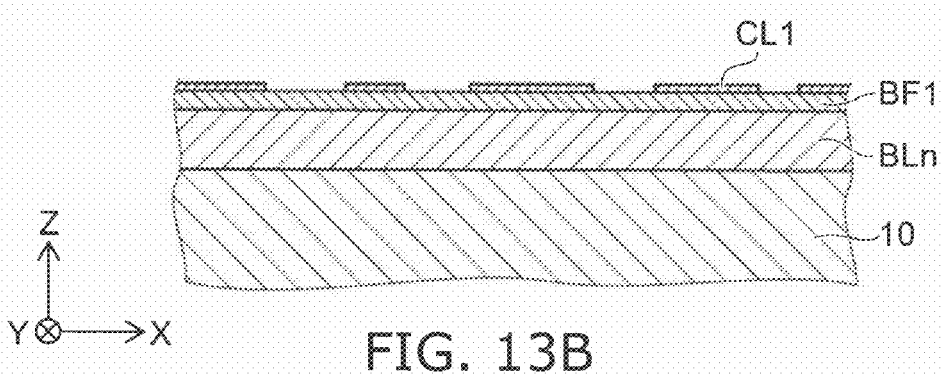

As illustrated in FIG. 12 and FIG. 13B, a first cap layer CL1 is formed in a portion on the first base layer BF1 (Step S120). The first base layer BF1 is grown from crystals made from GaN, for example. A portion of the first base layer BF1 is covered with the first cap layer CL1, and the other portion of the first base layer BF1 is not covered with the first cap layer CL1. The first cap layer CL1 is island-like formed, for example. The first cap layer CL1 is provided in a mesh form, for example. The average thickness of the first cap layer CL1 is about 2 nm or less, for example.

Figure 13C:
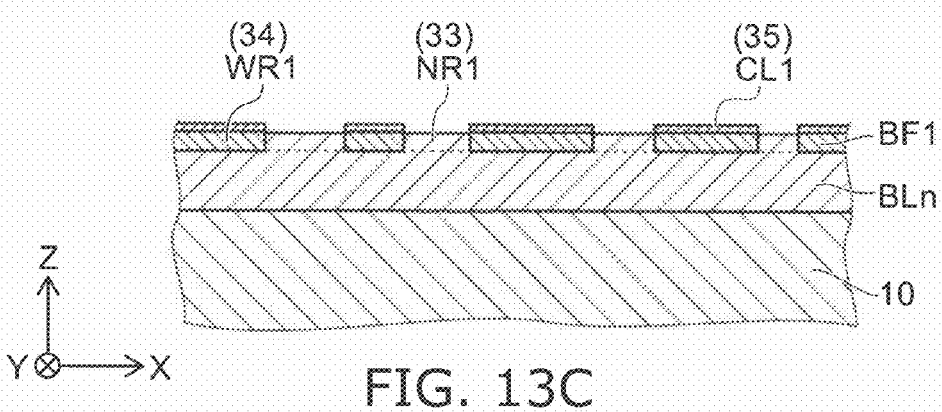

As illustrated in FIG. 12 and FIG. 13C, the In content in the portion of the first base layer BF1 not covered by the first cap layer CL1 is reduced, so the above-described portion of the first base layer BF1 not covered by the first cap layer CL1 is transformed into the first non-well layer region NR1, so the first light emitting layer LE1 that includes the first well layer region WR1 that includes the portion covered by the first cap layer CL1 and the first non-well layer region NR1 is formed (Step S130). For example, by raising the temperature, In is released from the portion of the first base layer BF1 not covered by the first cap layer CL1, and the In composition ratio of this portion is reduced. Thereby, the first non-well layer region NR1 is formed, which is a region that contains substantially no In, for example.

Figure 13D:
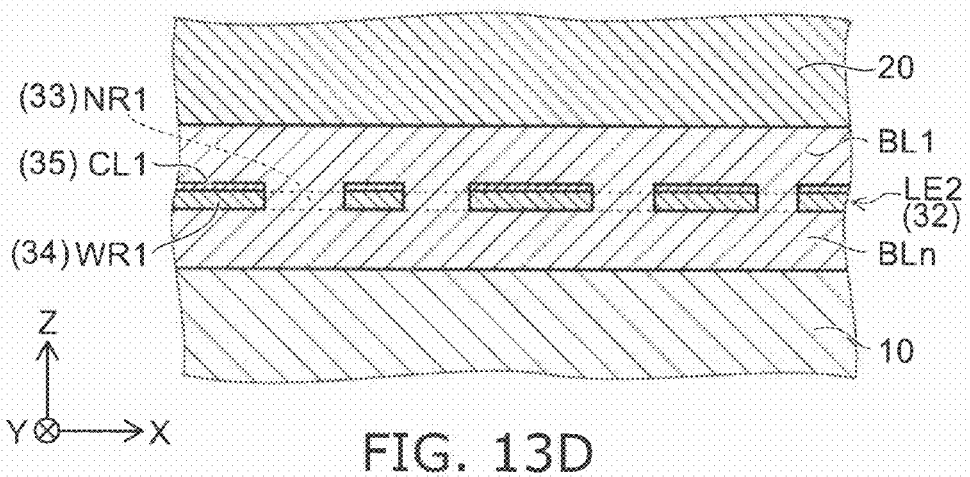

As illustrated in FIG. 12 and FIG. 13D, a first barrier layer BL1 is formed on the first light emitting layer LE1 and on the first cap layer CL1 (Step S140). The first barrier layer BL1 is grown from crystals made from GaN. The thickness of the first barrier layer BL1 is 6 nm, for example.

Then, a p-type semiconductor layer 20 is formed on the first barrier layer BL1 (Step S150). As explained already, the p-type semiconductor layer 20 is formed on the first barrier layer BL1 by forming a first p-side layer 21, a second p-side layer 22, and a third p-side layer 23 in sequence.

According to the method for manufacturing a semiconductor light emitting device according to this embodiment, the light emitting layers 32 having the well layer regions 34 and non-well layer regions 33 can be simply and stably formed, and high crystal quality can be maintained in light emitting layers having high In composition ratio. Thereby, it is possible to manufacture semiconductor light emitting devices with high luminous efficiency for long wavelengths.

Figure 14:
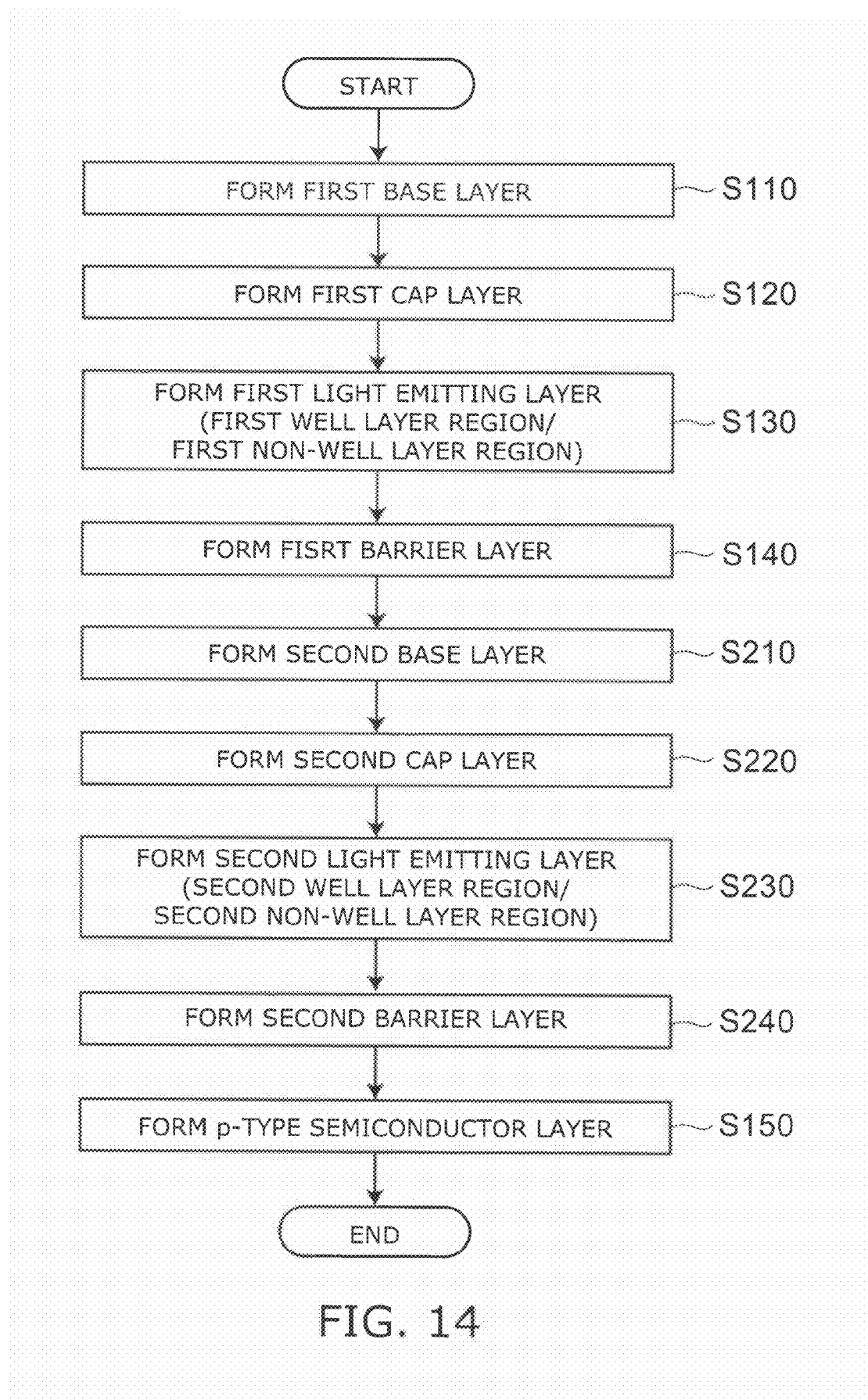
FIG. 14 is a flowchart illustrating another method for manufacturing the semiconductor light emitting device according to the second embodiment.

FIG. 14 is a flowchart illustrating another method for manufacturing a semiconductor light emitting device according to the second embodiment.

FIG. 15A to FIG. 15D are schematic cross-sectional views of processes, illustrating a method for manufacturing another semiconductor light emitting device according to the second embodiment.

As illustrated in FIG. 14, this manufacturing method further includes the following processes (Step S210 to Step S240) performed between forming the first barrier layer BL1 (Step S140) and forming the p-type semiconductor layer 20 (Step S150) in the manufacturing method illustrated in FIG. 12.

Figure 15A:
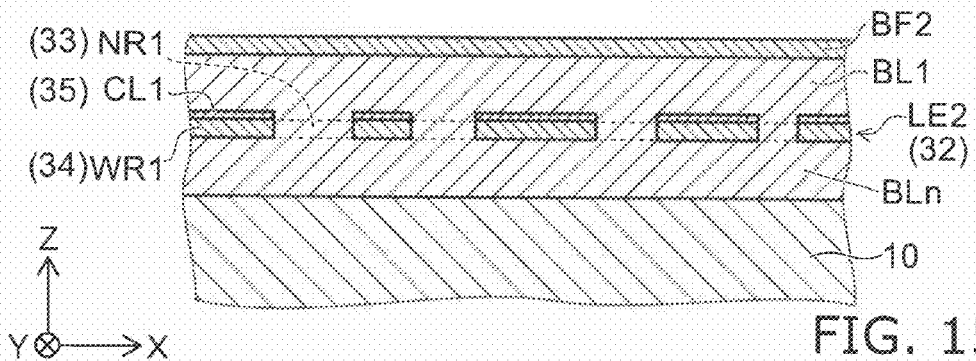
FIG. 15A to FIG. 15D are schematic cross-sectional views of processes, illustrating a method for manufacturing another semiconductor light emitting device according to the second embodiment.

As illustrated in FIG. 15A, a second base layer BF2 is formed on the first barrier layer BL1 (Step S210). The second base layer BF2 includes a nitride semiconductor that contains In with the same In composition ratio as the In composition ratio in the first base layer BF1.

Figure 15B:
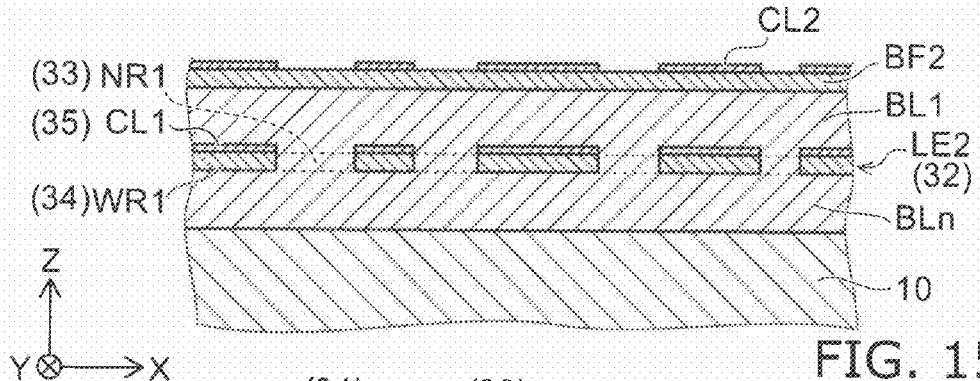

As illustrated in FIG. 15B, a second cap layer CL2 is formed in a portion on the second base layer BF2 (Step S220).

Figure 15C:
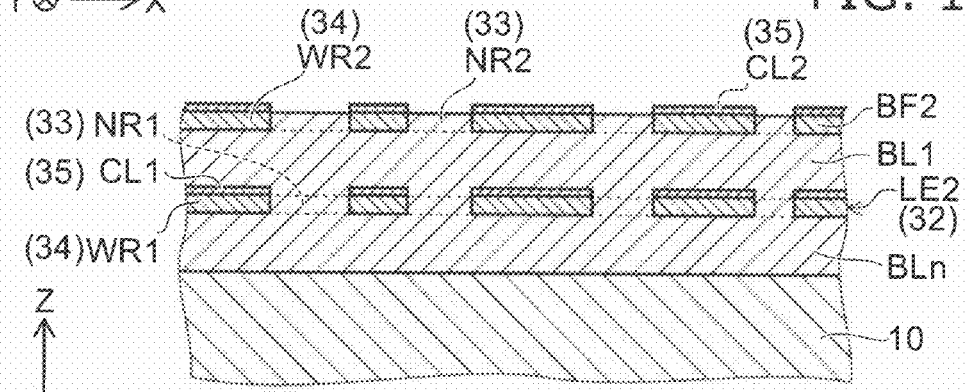
Figure 15D:
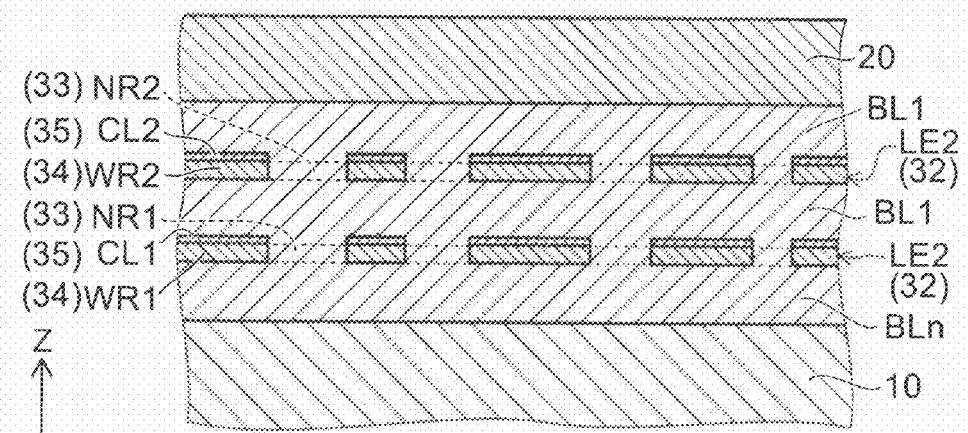

As illustrated in FIG. 15C, the In content in the portion of the second base layer BF2 not covered by the second cap layer CL2 is reduced, so the above-described portion of the second base layer BF2 not covered by the second cap layer CL2 is transformed into the second non-well layer region NR2, so the second light emitting layer LE2 that includes the second well layer region WR2 that includes the portion covered by the second cap layer CL2 and the second non-well layer region NR2 is formed (Step S230).

A second barrier layer BL2 is formed on the second light emitting layer LE2 and on the second cap layer CL2 (Step S240).

Then, a p-type semiconductor layer 20 is formed on the second barrier layer BL2.

Furthermore, the combination of forming the base layer, forming the cap layer 35, forming the light emitting layer 32 that includes the well layer regions 34 and the non-well layer regions 33 by removing the In from a portion of the base layer, and forming the barrier layer 31, may be repeatedly carried out for the arbitrary number of times. Thereby, it is possible to manufacture a semiconductor light emitting device having a light emitting part 30 with an MQW structure.

According to these embodiments, a semiconductor light emitting device having high luminous efficacy for long wavelength and a method for manufacturing the same can be provided.

In this specification, the term, "nitride semiconductor" includes semiconductors of all compositions wherein composition ratios of x, y, and z in the formula $B_xIn_yAl_zGa_{1-x-y-z}N$ fall within the respective ranges of $0 \leq x \leq 1, 0 \leq y \leq 1, 0 \leq z \leq 1$, and $x+y+z \leq 1$. Furthermore, in the formula described above, "nitride semiconductors" shall also be understood to include semiconductors further including group V elements other than N (nitrogen), semiconductors further including various elements added to control various physical properties such as conductivity type and the like, and semiconductors further including various elements that are included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

An embodiment of the invention with reference to examples was described above. However, the invention is not limited to these examples. The scope of the invention includes all cases in which, for example, a person skilled in the art could make use of publicly known information to appropriately select constituents such as substrates, buffer layers, n-type semiconductor layers, p-type semiconductor layers, light emitting parts, light emitting layers, barrier layers, well layer regions, non-well layer regions, stacked films (superlattice layers), electrodes, and the like included in semiconductor light emitting devices provided that the obtained effects are similar.

Further, any two or more components of the specific examples may be combined within the extent of technical feasibility; and are included in the scope of the invention to the extent that the purport of the invention is included.

Moreover, all semiconductor light emitting devices and methods for manufacturing the same practicable by an appropriate design modification by one skilled in the art based on the semiconductor light emitting devices and the methods for manufacturing the same described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor light emitting device comprising:
an n-type semiconductor layer including a nitride semiconductor;
a p-type semiconductor layer including a nitride semiconductor; and
a light emitting part provided between the n-type semiconductor layer and the p-type semiconductor layer and including:
a first light emitting layer including a nitride semiconductor and including;
a first well layer region including In with an In composition ratio among the group III elements not less than 20 atomic percent; and
a first non-well layer region juxtaposed with the first well layer region in a plane perpendicular to a first direction from the n-type semiconductor layer towards the p-type semiconductor layer, the first non-well layer region including an In composition ratio lower than an In composition ratio of the first well layer region;
a first barrier layer provided between the first light emitting layer and the p-type semiconductor layer and having a band gap energy larger than a band gap energy of the first well layer region;
a second light emitting layer provided between the first barrier layer and the p-type semiconductor and including a nitride semiconductor, the second light emitting layer including:

a second well layer region including In with an In composition ratio same as the In composition ratio of the first well layer region; and a second non-well layer region juxtaposed with the second well layer region in a plane perpendicular to the first direction, the second non-well layer region having an In composition ratio lower than the In composition ratio of the second well layer region;

a second barrier layer provided between the second light emitting layer and the p-type semiconductor layer and having a band gap energy larger than a band gap energy of the second well layer region; and an n-side barrier layer provided between the first light emitting layer and the n-type semiconductor layer and having a band gap energy larger than the band gap energy of the first well layer region, at least one of the first well layer region and the second well layer region including a portion having a width in a direction perpendicular to the first direction of 50 nanometers or more, wherein a peak wavelength of light emitted from the light emitting part is not less than 500 nanometers.

2. The device according to claim 1, wherein a length of at least one of the first non-well layer region and the second non-well layer region along a second direction perpendicular to the first direction is 30 percent or more of a length of the first light emitting layer and a length of the second light emitting layer along the second direction.

3. The device according to claim 1, wherein a proportion of an area of the first non-well layer region to a total of an area of the first non-well layer region and an area of the first well layer region is higher than 30%.

4. The device according to claim 1, wherein the In composition ratio among the group III elements of the first well layer region and the second well layer region is not lower than 28%.

5. The device according to claim 1, wherein the peak wavelength is not more than 560 nanometers.

6. The device according to claim 1, wherein a wavelength band of light emitted from the second well layer region is the same as a wavelength band of light emitted from the first well layer region.

7. The device according to claim 1, wherein the first well layer region has an island shape.

8. The device according to claim 1, wherein the first non-well layer region has an island shape.

9. A semiconductor light emitting device comprising:
an n-type semiconductor layer including a nitride semiconductor;
a p-type semiconductor layer including a nitride semiconductor; and
a light emitting part provided between the n-type semiconductor layer and the p-type semiconductor layer and including:
a first light emitting layer including a nitride semiconductor and including:
a first well layer region including In; and
a first non-well layer region juxtaposed with the first well layer region in a plane perpendicular to a first direction from the n-type semiconductor layer towards the p-type semiconductor layer, the first non-well layer having an In composition ratio lower than an In composition ratio of the first well layer region;
a first barrier layer provided between the first light emitting layer and the p-type semiconductor layer and having a band gap energy larger than a band gap energy of the first well layer region;

a first cap layer in contact with the first well layer region between the first well layer region and the first barrier layer; and an n-side barrier layer provided between the first light emitting layer and the n-type semiconductor layer and having a band gap energy larger than the band gap energy of the first well layer region;

a second light emitting layer including a nitride semiconductor and including:
a second well layer region provided between the first barrier layer and the p-type semiconductor layer and including In with an In composition ratio same as the In composition ratio of the first well layer region; and
a second non-well layer region juxtaposed with the second well layer region in a plane perpendicular to the first direction and having an In composition ratio lower than the In composition ratio of the second well layer region;
a second barrier layer provided between the second light emitting layer and the p-type semiconductor layer and having a band gap energy larger than a band gap energy of the second well layer region; and
a second cap layer in contact with the second well layer region between the second well layer region and the second barrier layer, wherein a peak wavelength of light emitted from the light emitting part is not less than 500 nanometers.

10. A semiconductor light emitting device comprising:
an n-type semiconductor layer including a nitride semiconductor;
a p-type semiconductor layer including a nitride semiconductor; and
a light emitting part provided between the n-type semiconductor layer and the p-type semiconductor layer and including:
a first light emitting layer including a nitride semiconductor and including:
a first well layer region including In; and
a first non-well layer region juxtaposed with the first well layer region in a plane perpendicular to a first direction from the n-type semiconductor layer towards the p-type semiconductor layer, the first non-well layer having an In composition ratio lower than an In composition ratio of the first well layer region;
a first barrier layer provided between the first light emitting layer and the p-type semiconductor layer and having a band gap energy larger than a band gap energy of the first well layer region;
a first cap layer in contact with the first well layer region between the first well layer region and the first barrier layer;
an n-side barrier layer provided between the first light emitting layer and the n-type semiconductor layer and having a band gap energy larger than the band gap energy of the first well layer region;

wherein the first well layer region includes a portion having a width in a direction perpendicular to the first direction of 50 nanometers or more, and a peak wavelength of light emitted from the light emitting part is not less than 500 nanometers.

11. The device according to claim 9, wherein the first cap layer is not provided between the first light emitting layer and the p-type semiconductor layer.

12. The device according to claim 9, wherein a proportion of an area of the first non-well layer region to a total of an area of the first non-well layer region and an area of the first well layer region is higher than 30%.

13. The device according to claim 9, wherein the In composition ratio among the group III elements of the first well layer region is not lower than 20% and not higher than 28%.

14. The device according to claim 9, wherein the peak wavelength is not more than 560 nanometers.

15. The device according to claim 9, wherein a wavelength band of light emitted from the second well layer region is the same as a wavelength band of light emitted from the first well layer region.

16. The device according to claim 9, wherein the first well layer region has an island shape.

17. The device according to claim 9, wherein the first non-well layer region has an island shape.

* * * * *